(12) United States Patent
Salter et al.

(10) Patent No.: US 10,038,443 B2
(45) Date of Patent: Jul. 31, 2018

(54) DIRECTIONAL PROXIMITY SWITCH ASSEMBLY

(71) Applicant: Ford Global Technologies, LLC, Dearborn, MI (US)

(72) Inventors: Stuart C. Salter, White Lake, MI (US); Pietro Buttolo, Dearborn Heights, MI (US); Mahendra Somasara Dassanayake, Bloomfield Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 850 days.

(21) Appl. No.: 14/518,141

(22) Filed: Oct. 20, 2014

(65) Prior Publication Data

US 2016/0112044 A1   Apr. 21, 2016

(51) Int. Cl.
*H03K 17/955*   (2006.01)

(52) U.S. Cl.
CPC ........ *H03K 17/955* (2013.01); *H03K 2217/960705* (2013.01); *H03K 2217/960775* (2013.01)

(58) Field of Classification Search
CPC ......... H03K 2217/960705; H03K 17/955
See application file for complete search history.

(56) References Cited

U.S. PATENT DOCUMENTS

| | | |
|---|---|---|
| 3,382,588 A | 5/1968 | Serrell et al. |
| 3,544,804 A | 12/1970 | Gaumer et al. |
| 3,671,750 A | 6/1971 | Heitmann et al. |
| 3,691,396 A | 9/1972 | Hinrichs |
| 3,707,671 A | 12/1972 | Morrow et al. |
| 3,725,589 A | 4/1973 | Golden |
| 3,826,979 A | 7/1974 | Steinmann |
| 3,950,748 A | 4/1976 | Busy |
| 4,204,204 A | 5/1980 | Pitstick |
| 4,205,325 A | 5/1980 | Haygood et al. |
| 4,232,289 A | 11/1980 | Daniel |

(Continued)

FOREIGN PATENT DOCUMENTS

| | | |
|---|---|---|
| CN | 101853099 A | 10/2010 |
| DE | 4024052 | 1/1992 |

(Continued)

OTHER PUBLICATIONS

"Clevios P Formulation Guide," 12 pages, www.clevios.com, Heraeus Clevios GmbH, no date provided.

(Continued)

*Primary Examiner* — Thienvu Tran
*Assistant Examiner* — Pinping Sun
(74) *Attorney, Agent, or Firm* — Vichit Chea; Price Heneveld LLP

(57) ABSTRACT

A proximity switch assembly is provided and includes a proximity sensor comprising a first electrode comprising first fingers and a second electrode comprising second fingers, wherein the first and second fingers are interdigitated with a varying density and a variable spacing therebetween along a first direction. The proximity switch assembly also includes control circuitry processing a signal in response to a user activation of the proximity sensor and determining sliding activation of the sensor in the first direction. The switch assembly may determine a tap, stable press and sliding activations.

16 Claims, 13 Drawing Sheets

(56) References Cited

U.S. PATENT DOCUMENTS

| | | |
|---|---|---|
| 4,257,117 A | 3/1981 | Besson |
| 4,290,052 A | 9/1981 | Eichelberger et al. |
| 4,340,813 A | 7/1982 | Sauer |
| 4,370,646 A | 1/1983 | Mahony |
| 4,374,381 A | 2/1983 | Ng et al. |
| 4,377,049 A | 3/1983 | Simon et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,954,823 A | 9/1990 | Binstead |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,050,634 A | 9/1991 | Fiechtner |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,212,621 A | 5/1993 | Panter |
| 5,215,811 A | 6/1993 | Reafler et al. |
| 5,225,959 A | 7/1993 | Stearns |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,367,199 A | 11/1994 | Lefkowitz et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,526,294 A | 6/1996 | Ono et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,015 A | 8/1998 | Iitsuka |
| 5,790,107 A | 8/1998 | Kasser et al. |
| 5,796,183 A | 8/1998 | Hourmand |
| 5,801,340 A | 9/1998 | Peter |
| 5,825,352 A | 10/1998 | Bisset et al. |
| 5,827,980 A | 10/1998 | Doemens et al. |
| 5,844,287 A | 12/1998 | Hassan et al. |
| 5,864,105 A | 1/1999 | Andrews |
| 5,867,111 A | 2/1999 | Caldwell et al. |
| 5,874,672 A | 2/1999 | Gerardi et al. |
| 5,880,538 A | 3/1999 | Schulz |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 5,982,608 A | 11/1999 | Kalnitsky et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,047,964 A | 4/2000 | Lawandy et al. |
| 6,075,460 A | 6/2000 | Minissale et al. |
| 6,140,914 A | 10/2000 | Mueller et al. |
| 6,157,372 A | 12/2000 | Blackburn et al. |
| 6,172,666 B1 | 1/2001 | Okura |
| 6,189,381 B1 * | 2/2001 | Huang ............... G01C 19/5656 |
| | | 73/504.12 |
| 6,215,476 B1 | 4/2001 | Depew et al. |
| 6,219,253 B1 | 4/2001 | Green |
| 6,231,111 B1 | 5/2001 | Carter et al. |
| 6,259,045 B1 | 7/2001 | Imai |
| 6,275,644 B1 | 8/2001 | Domas et al. |
| 6,288,707 B1 | 9/2001 | Philipp |
| 6,292,100 B1 | 9/2001 | Dowling |
| 6,297,811 B1 | 10/2001 | Kent et al. |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,404,158 B1 | 6/2002 | Boisvert et al. |
| 6,415,138 B2 | 7/2002 | Sirola et al. |
| 6,427,540 B1 | 8/2002 | Monroe et al. |
| 6,438,257 B1 | 8/2002 | Morimura et al. |
| 6,445,192 B1 | 9/2002 | Lovegren et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,535,694 B2 | 3/2003 | Engle et al. |
| 6,537,359 B1 | 3/2003 | Spa |
| 6,538,579 B1 | 3/2003 | Yoshikawa et al. |
| 6,559,902 B1 | 5/2003 | Kusuda et al. |
| 6,587,097 B1 | 7/2003 | Aufderheide et al. |
| 6,603,306 B1 | 8/2003 | Olsson et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,646,398 B1 | 11/2003 | Fukazawa et al. |
| 6,652,777 B2 | 11/2003 | Rapp et al. |
| 6,654,006 B2 | 11/2003 | Kawashima et al. |
| 6,661,239 B1 | 12/2003 | Ozick |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |

(56) References Cited

U.S. PATENT DOCUMENTS

| | | | |
|---|---|---|---|
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,847,289 B2 | 1/2005 | Pang et al. |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,943,705 B1 | 9/2005 | Bolender et al. |
| 6,960,735 B2 | 11/2005 | Hein et al. |
| 6,962,436 B1 | 11/2005 | Holloway et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,836 B2 | 8/2006 | Kachouh et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,178,405 B2 | 2/2007 | Sato |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | Mc Call |
| 7,248,955 B2 | 7/2007 | Hein et al. |
| 7,254,775 B2 | 8/2007 | Geaghan et al. |
| 7,255,466 B2 | 8/2007 | Schmidt et al. |
| 7,255,622 B2 | 8/2007 | Stevenson et al. |
| 7,269,484 B2 | 9/2007 | Hein |
| 7,279,647 B2 | 10/2007 | Philipp |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,347,297 B2 | 3/2008 | Ide et al. |
| 7,355,593 B2 | 4/2008 | Hill et al. |
| 7,355,595 B2 | 4/2008 | Bathiche et al. |
| 7,358,963 B2 | 4/2008 | Low et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,447,575 B2 | 11/2008 | Goldbeck et al. |
| 7,479,788 B2 | 1/2009 | Bolender et al. |
| 7,489,053 B2 | 2/2009 | Gentile et al. |
| 7,518,381 B2 * | 4/2009 | Lamborghini ......... B60K 37/06 |
| | | 324/658 |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,576,611 B2 | 8/2009 | Glaser |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,654,147 B2 | 2/2010 | Witte et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,710,245 B2 | 5/2010 | Pickering |
| 7,714,846 B1 | 5/2010 | Gray |
| 7,719,142 B2 | 5/2010 | Hein et al. |
| 7,720,611 B2 | 5/2010 | Lerner |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,812,825 B2 * | 10/2010 | Sinclair ............... G06F 3/03547 |
| | | 178/18.06 |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,076,949 B1 | 12/2011 | Best et al. |
| 8,077,154 B2 | 12/2011 | Emig et al. |
| 8,090,497 B2 | 1/2012 | Ando |
| 8,253,425 B2 | 8/2012 | Reynolds et al. |
| 8,269,724 B2 * | 9/2012 | Sakurai .................. G06F 3/044 |
| | | 345/173 |
| 8,279,092 B2 | 10/2012 | Vanhelle et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,386,027 B2 | 2/2013 | Chuang et al. |
| 8,400,423 B2 | 3/2013 | Chang et al. |
| 8,415,959 B2 | 4/2013 | Badaye |
| 8,454,181 B2 | 6/2013 | Salter et al. |
| 8,456,180 B2 | 6/2013 | Sitarski |
| 8,508,487 B2 | 8/2013 | Schwesig et al. |
| 8,514,185 B2 * | 8/2013 | Hotelling ................ G06F 3/044 |
| | | 345/156 |
| 8,517,383 B2 | 8/2013 | Wallace et al. |
| 8,537,107 B1 | 9/2013 | Li |
| 8,558,346 B1 * | 10/2013 | Cheng ................. H01L 23/5223 |
| | | 257/532 |
| 8,570,053 B1 | 10/2013 | Ryshtun et al. |
| 8,575,949 B2 | 11/2013 | Salter et al. |
| 8,599,144 B2 | 12/2013 | Peng et al. |
| 8,619,054 B2 | 12/2013 | Philipp et al. |
| 8,619,058 B2 | 12/2013 | Ito et al. |
| 8,624,609 B2 | 1/2014 | Philipp et al. |
| 8,659,414 B1 | 2/2014 | Schuk |
| 8,688,330 B2 | 4/2014 | Werner et al. |
| 8,724,038 B2 | 5/2014 | Ganapathi et al. |
| 8,736,577 B2 | 5/2014 | Land et al. |
| 8,796,575 B2 | 8/2014 | Salter et al. |
| 8,816,967 B2 | 8/2014 | Lyon et al. |
| 8,908,034 B2 | 12/2014 | Bordonaro |
| 8,933,708 B2 | 1/2015 | Buttolo et al. |

(56) References Cited

U.S. PATENT DOCUMENTS

| | | |
|---|---|---|
| 8,981,265 B2 | 3/2015 | Jiao et al. |
| 9,088,282 B2 | 7/2015 | Holenarsipur et al. |
| 9,110,111 B1 | 8/2015 | Kapila et al. |
| 9,143,127 B2 | 9/2015 | Tamura et al. |
| 9,152,278 B2* | 10/2015 | Kent .............. G06F 3/0418 |
| 9,182,837 B2 | 11/2015 | Day |
| 9,274,652 B2 | 3/2016 | Chang et al. |
| 9,372,538 B2 | 6/2016 | Pala et al. |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0101781 A1 | 6/2003 | Budzynski et al. |
| 2003/0122554 A1 | 7/2003 | Karray et al. |
| 2003/0128116 A1 | 7/2003 | Ieda et al. |
| 2003/0168271 A1 | 9/2003 | Massen |
| 2003/0189211 A1 | 10/2003 | Dietz |
| 2004/0056753 A1 | 3/2004 | Chiang et al. |
| 2004/0090195 A1 | 5/2004 | Motsenbocker |
| 2004/0145613 A1 | 7/2004 | Stavely et al. |
| 2004/0160072 A1 | 8/2004 | Carter et al. |
| 2004/0160234 A1 | 8/2004 | Denen et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0012484 A1 | 1/2005 | Gifford et al. |
| 2005/0052429 A1 | 3/2005 | Philipp |
| 2005/0068045 A1 | 3/2005 | Inaba et al. |
| 2005/0068712 A1 | 3/2005 | Schulz et al. |
| 2005/0073317 A1 | 4/2005 | Yamamoto et al. |
| 2005/0073425 A1 | 4/2005 | Snell et al. |
| 2005/0088417 A1 | 4/2005 | Mulligan |
| 2005/0092097 A1 | 5/2005 | Shank et al. |
| 2005/0110769 A1 | 5/2005 | DaCosta et al. |
| 2005/0137765 A1 | 6/2005 | Hein et al. |
| 2005/0183508 A1 | 8/2005 | Sato |
| 2005/0218913 A1 | 10/2005 | Inaba et al. |
| 2005/0229703 A1* | 10/2005 | Geen ............... G01C 19/5719 73/510 |
| 2005/0242923 A1 | 11/2005 | Pearson et al. |
| 2005/0275567 A1 | 12/2005 | DePue et al. |
| 2005/0283280 A1 | 12/2005 | Evans, Jr. |
| 2006/0022682 A1 | 2/2006 | Nakamura et al. |
| 2006/0038793 A1 | 2/2006 | Philipp |
| 2006/0044800 A1 | 3/2006 | Reime |
| 2006/0052907 A1 | 3/2006 | Hein |
| 2006/0055553 A1 | 3/2006 | Fergusson |
| 2006/0082545 A1 | 4/2006 | Choquet et al. |
| 2006/0170241 A1 | 8/2006 | Yamashita |
| 2006/0238518 A1 | 10/2006 | Westerman et al. |
| 2006/0238521 A1 | 10/2006 | Westerman et al. |
| 2006/0244733 A1 | 11/2006 | Geaghan |
| 2006/0250142 A1 | 11/2006 | Abe |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0024596 A1 | 2/2007 | Takahashi |
| 2007/0051609 A1 | 3/2007 | Parkinson |
| 2007/0068790 A1 | 3/2007 | Yerdon et al. |
| 2007/0096565 A1 | 5/2007 | Breed et al. |
| 2007/0103431 A1 | 5/2007 | Tabatowski-Bush |
| 2007/0115759 A1 | 5/2007 | Sane |
| 2007/0165005 A1 | 7/2007 | Lii et al. |
| 2007/0206668 A1 | 9/2007 | Jin |
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |
| 2007/0257891 A1 | 11/2007 | Esenther et al. |
| 2007/0271072 A1 | 11/2007 | Kovacevich |
| 2007/0291016 A1 | 12/2007 | Philipp |
| 2007/0296709 A1 | 12/2007 | GuangHai |
| 2008/0012835 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1 | 3/2008 | Wright |
| 2008/0084398 A1 | 4/2008 | Ito et al. |
| 2008/0111714 A1 | 5/2008 | Kremin |
| 2008/0136792 A1 | 6/2008 | Peng et al. |
| 2008/0142352 A1 | 6/2008 | Wright |
| 2008/0143681 A1 | 6/2008 | XiaoPing |
| 2008/0150625 A1 | 6/2008 | Sundstrom |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0205714 A1* | 8/2008 | Benkley ............... G06F 3/03547 382/126 |
| 2008/0211519 A1 | 9/2008 | Kurumado et al. |
| 2008/0231290 A1 | 9/2008 | Zhitomirsky |
| 2008/0238650 A1 | 10/2008 | Riihimaki et al. |
| 2008/0246723 A1 | 10/2008 | Baumbach |
| 2008/0257706 A1 | 10/2008 | Haag |
| 2008/0272623 A1 | 11/2008 | Kadzban et al. |
| 2009/0009482 A1 | 1/2009 | McDermid |
| 2009/0046110 A1 | 2/2009 | Sadler et al. |
| 2009/0066659 A1 | 3/2009 | He et al. |
| 2009/0079699 A1 | 3/2009 | Sun |
| 2009/0100930 A1* | 4/2009 | Coronato ............ G01C 19/5712 73/504.12 |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0212849 A1 | 8/2009 | Reime |
| 2009/0225043 A1 | 9/2009 | Rosener |
| 2009/0235588 A1 | 9/2009 | Patterson et al. |
| 2009/0236210 A1 | 9/2009 | Clark et al. |
| 2009/0251435 A1 | 10/2009 | Westerman et al. |
| 2009/0256578 A1 | 10/2009 | Wuerstlein et al. |
| 2009/0256677 A1 | 10/2009 | Hein et al. |
| 2009/0273563 A1 | 11/2009 | Pryor |
| 2009/0273573 A1 | 11/2009 | Hotelling |
| 2009/0295409 A1 | 12/2009 | Irkliy |
| 2009/0295556 A1 | 12/2009 | Inoue et al. |
| 2009/0309616 A1 | 12/2009 | Klinghult et al. |
| 2010/0001746 A1 | 1/2010 | Duchene et al. |
| 2010/0001974 A1 | 1/2010 | Su et al. |
| 2010/0007613 A1 | 1/2010 | Costa |
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |
| 2010/0053087 A1 | 3/2010 | Dai et al. |
| 2010/0066391 A1 | 3/2010 | Hirasaka et al. |
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0117970 A1 | 5/2010 | Burstrom et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0212819 A1 | 8/2010 | Salter et al. |
| 2010/0214253 A1 | 8/2010 | Wu et al. |
| 2010/0219935 A1 | 9/2010 | Bingle et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |

(56) References Cited

U.S. PATENT DOCUMENTS

| | | |
|---|---|---|
| 2010/0252048 A1 | 10/2010 | Young et al. |
| 2010/0252408 A1 | 10/2010 | Yamauchi et al. |
| 2010/0257933 A1* | 10/2010 | Verjus ............... G01C 19/5755 73/504.04 |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1 | 12/2010 | Netherton et al. |
| 2010/0309160 A1 | 12/2010 | Lin |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012378 A1 | 1/2011 | Ueno et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0041409 A1 | 2/2011 | Newman et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0057899 A1 | 3/2011 | Sleeman et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0074684 A1 | 3/2011 | Abraham et al. |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0084707 A1 | 4/2011 | Nakayama et al. |
| 2011/0095997 A1 | 4/2011 | Philipp |
| 2011/0096025 A1 | 4/2011 | Slobodin et al. |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0139934 A1 | 6/2011 | Giesa et al. |
| 2011/0141006 A1 | 6/2011 | Rabu |
| 2011/0141041 A1 | 6/2011 | Parkinson et al. |
| 2011/0141052 A1* | 6/2011 | Bernstein ............... G06F 3/016 345/174 |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0163764 A1 | 7/2011 | Shank et al. |
| 2011/0169758 A1 | 7/2011 | Aono |
| 2011/0181387 A1 | 7/2011 | Popelard |
| 2011/0187492 A1 | 8/2011 | Newman et al. |
| 2011/0210755 A1 | 9/2011 | Ogawa |
| 2011/0227872 A1 | 9/2011 | Huska et al. |
| 2011/0248941 A1* | 10/2011 | Abdo ............... G06F 3/0488 345/173 |
| 2011/0279276 A1 | 11/2011 | Newham |
| 2011/0279409 A1 | 11/2011 | Salaverry et al. |
| 2011/0309912 A1 | 12/2011 | Muller |
| 2012/0007821 A1 | 1/2012 | Zaliva |
| 2012/0037485 A1 | 2/2012 | Sitarski |
| 2012/0043973 A1 | 2/2012 | Kremin |
| 2012/0043976 A1 | 2/2012 | Bokma et al. |
| 2012/0055557 A1 | 3/2012 | Belz et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0075246 A1 | 3/2012 | Chang et al. |
| 2012/0104790 A1 | 5/2012 | Plavetich et al. |
| 2012/0126941 A1 | 5/2012 | Coggill |
| 2012/0154324 A1 | 6/2012 | Wright et al. |
| 2012/0160657 A1 | 6/2012 | Mizushima |
| 2012/0161795 A1 | 6/2012 | Pfau et al. |
| 2012/0194460 A1 | 8/2012 | Kuwabara et al. |
| 2012/0217147 A1 | 8/2012 | Porter et al. |
| 2012/0293447 A1 | 11/2012 | Heng et al. |
| 2012/0312676 A1 | 12/2012 | Salter et al. |
| 2012/0313648 A1 | 12/2012 | Salter et al. |
| 2012/0313767 A1 | 12/2012 | Sitarski |
| 2012/0319992 A1 | 12/2012 | Lee |
| 2013/0002419 A1 | 1/2013 | Lee |
| 2013/0024169 A1 | 1/2013 | Veerasamy |
| 2013/0033356 A1 | 2/2013 | Sitarski et al. |
| 2013/0036529 A1 | 2/2013 | Salter et al. |
| 2013/0076121 A1 | 3/2013 | Salter et al. |
| 2013/0076375 A1 | 3/2013 | Hanumanthaiah et al. |
| 2013/0093500 A1 | 4/2013 | Bruwer |
| 2013/0106436 A1 | 5/2013 | Brunet et al. |
| 2013/0113397 A1 | 5/2013 | Salter et al. |
| 2013/0113544 A1 | 5/2013 | Salter et al. |
| 2013/0126325 A1 | 5/2013 | Curtis et al. |
| 2013/0147709 A1 | 6/2013 | Kim et al. |
| 2013/0162596 A1 | 6/2013 | Kono et al. |
| 2013/0170013 A1 | 7/2013 | Tonar et al. |
| 2013/0241578 A1 | 9/2013 | Satake et al. |
| 2013/0244731 A1* | 9/2013 | Oishi ............... H04M 1/23 455/566 |
| 2013/0270896 A1 | 10/2013 | Buttolo et al. |
| 2013/0270899 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0321065 A1 | 12/2013 | Salter et al. |
| 2013/0328616 A1* | 12/2013 | Buttolo ............... H03K 17/955 327/517 |
| 2014/0002405 A1* | 1/2014 | Salter ............... H03K 17/962 345/174 |
| 2014/0047918 A1* | 2/2014 | Swanson ............... G01C 19/56 73/504.12 |
| 2014/0069015 A1 | 3/2014 | Salter et al. |
| 2014/0076063 A1* | 3/2014 | Lisseman ............... G01L 1/142 73/862.68 |
| 2014/0116869 A1 | 5/2014 | Salter et al. |
| 2014/0145733 A1 | 5/2014 | Buttolo et al. |
| 2014/0210257 A1 | 7/2014 | Buttolo et al. |
| 2014/0252879 A1 | 9/2014 | Dassanayake et al. |
| 2014/0278194 A1 | 9/2014 | Buttolo et al. |
| 2014/0278240 A1 | 9/2014 | Buttolo et al. |
| 2014/0292396 A1* | 10/2014 | Bruwer ............... H03K 17/955 327/517 |
| 2014/0293158 A1 | 10/2014 | Kurasawa et al. |
| 2014/0300403 A1 | 10/2014 | Okamoto et al. |
| 2014/0306723 A1 | 10/2014 | Salter et al. |
| 2014/0306724 A1 | 10/2014 | Dassanayake et al. |
| 2015/0042603 A1 | 2/2015 | Takano et al. |
| 2015/0077227 A1 | 3/2015 | Salter et al. |
| 2015/0177876 A1 | 6/2015 | Ishii et al. |
| 2015/0180471 A1 | 6/2015 | Buttolo et al. |

(56) References Cited

U.S. PATENT DOCUMENTS

2015/0229305 A1    8/2015    Buttolo et al.
2015/0234493 A1    8/2015    Parivar et al.

FOREIGN PATENT DOCUMENTS

| | | |
|---|---|---|
| EP | 1152443 | 11/2001 |
| EP | 1327860 | 7/2003 |
| EP | 1562293 | 8/2005 |
| EP | 2133777 | 10/2011 |
| GB | 2071338 | 9/1981 |
| GB | 2158737 | 11/1985 |
| GB | 2279750 | 1/1995 |
| GB | 2409578 | 6/2005 |
| GB | 2418741 | 4/2006 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 | 9/2010 |
| JP | 2010239587 | 10/2010 |
| JP | 2010287148 | 12/2010 |
| JP | 2011014280 | 1/2011 |
| KR | 20040110463 | 12/2004 |
| KR | 20090127544 | 12/2009 |
| KR | 20100114768 | 10/2010 |
| KR | 101258376 | 4/2013 |
| TW | 201032114 A | 9/2010 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |
| WO | 2009054592 | 4/2009 |
| WO | 2010111362 | 9/2010 |
| WO | 2012032318 | 3/2012 |
| WO | 2012169106 | 12/2012 |

OTHER PUBLICATIONS

"Introduction to Touch Solutions, White Paper, Revision 1.0 A," Densitron Corporation, 14 pages, Aug. 21, 2007.

Kliffken, Marksu G. et al., "Obstacle Detection for Power Operated Window-Lift and Sunroof Actuation Systems," Paper No. 2001-01 0466, 1 page, © 2011 SAE International, Published Mar. 5, 2001.

NXP Capacitive Sensors, 1 page, www.nxp.com, copyrighted 2006-2010, NXP Semiconductors.

"Moisture Immunity in QuickSense Studio," AN552, Rev. 0.1 10/10, 8 pages, Silicon Laboratories, Inc., © 2010.

"Orgacon EL-P3000, Screen printing Ink Series 3000," 2 pages, AGFA, last updated in Feb. 2006.

"Charge-Transfer Sensing-Based Touch Controls Facilitate Creative Interfaces," www.ferret.com.au, 2 pages, Jan. 18, 2006.

Kiosk Peripherals, "Touch Screen," www.bitsbytesintegrators.com/kiosk-peripherals.html, 10 pages, no date provided.

JVC KD-AVX777 Detachable Front-Panel with Integrated 5.4" Touch-Screen Monitor, 6 pages, www.crutchfield.com, no date provided.

Ergonomic Palm Buttons, Pepperl+Fuchs, www.wolfautomation.com, 6 pages, no date provided.

"Touch Sensors Design Guide" by ATMEL, 10620 D-AT42-04/09, Revised Apr. 2009, 72 pages, Copyrighted 2008-2009 Atmel Corporation.

"Capacitive Touch Switches for Automotive Applications," by Dave Van Ess of Cypress Semiconductor Corp., published in Automotive DesignLine (http://www.automotivedesignline.com), Feb. 2006, 7 pages.

U.S. Appl. No. 14/717,031, filed May 20, 2015, entitled "Proximity Sensor Assembly Having Interleaved Electrode Configuration," (38 pages of specification and 21 pages of drawings) and Official Filing Receipt (3 pages).

U.S. Appl. No. 14/689,324, filed Apr. 17, 2015, entitled "Proximity Switch Assembly With Signal Drift Rejection and Method," (35 pages of specification and 17 pages of drawings) and Official Filing Receipt (3 pages).

U.S. Appl. No. 14/552,809, filed Nov. 25, 2014, entitled "Proximity Switch Based Door Latch Release," (14 pages of specification and 4 pages of drawings) and Official Filing Receipt (3 pages).

U.S. Appl. No. 14/635,140, filed Mar. 2, 2015, entitled "Proximity Switch Having Wrong Touch Adaptive Learning and Method," (20 pages of specification and 7 pages of drawings) and Official Filing Receipt (3 pages).

U.S. Appl. No. 14/661,325, filed Mar. 18, 2015, entitled "Proximity Switch Assembly Having Haptic Feedback and Method," (31 pages of specification and 15 pages of drawings) and Official Filing Receipt (3 pages).

* cited by examiner

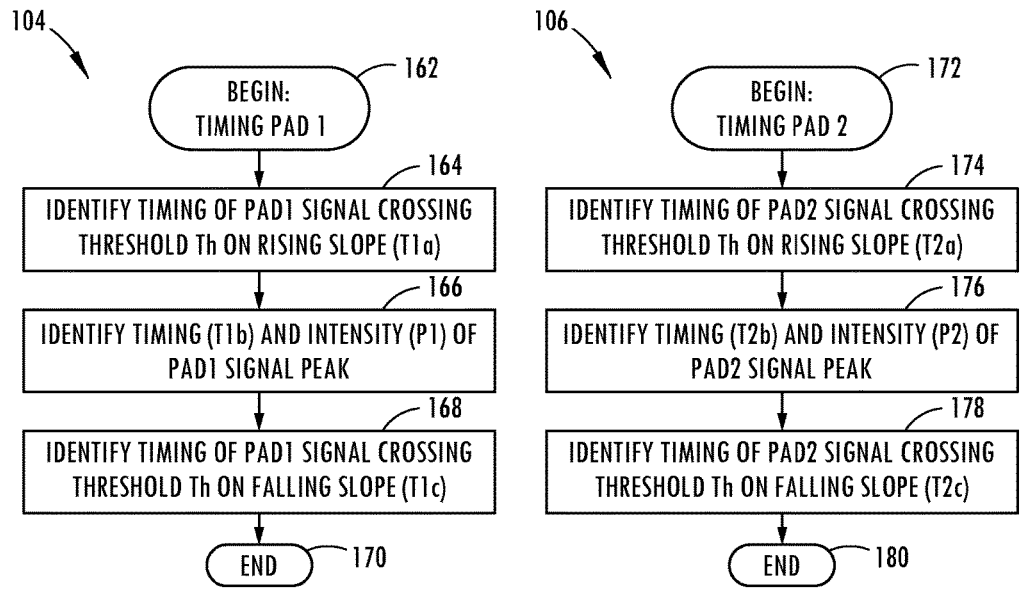
FIG. 12       FIG. 13
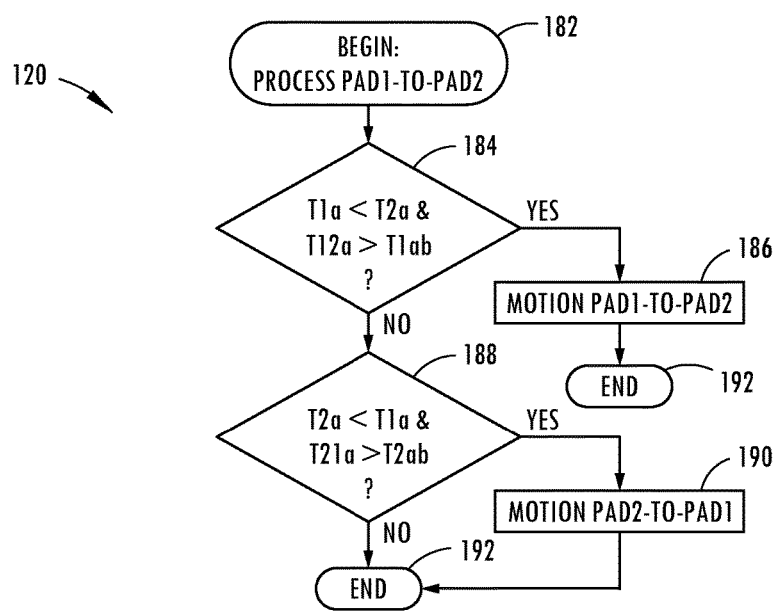
FIG. 14

US 10,038,443 B2

DIRECTIONAL PROXIMITY SWITCH ASSEMBLY

FIELD OF THE INVENTION

The present invention generally relates to switches, and more particularly relates to proximity switches having enhanced switch activation.

BACKGROUND OF THE INVENTION

Automotive vehicles are typically equipped with various user actuatable switches, such as switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field to a threshold.

Switch assemblies often employ a plurality of capacitive switches in close proximity to one another and generally require that a user select a single desired capacitive switch to perform an intended operation. Some switch assemblies employ an array of sensors to detect a sliding activation. In some applications, such as use in an automobile, it may be desirable to provide for a proximity switch arrangement which enhances the use of proximity switches by a person, such as a driver of a vehicle.

SUMMARY OF THE INVENTION

According to one aspect of the present invention, a proximity switch assembly is provided. The proximity switch assembly includes a proximity sensor comprising a first electrode comprising first fingers and a second electrode comprising second fingers, wherein the first and second fingers are interdigitated with variable spacing therebetween along a first direction. The proximity switch assembly also includes control circuitry processing a signal in response to a user activation of the proximity sensor and determining sliding activation of the sensor in the first direction.

According to another aspect of the present invention, a proximity switch assembly is provided. The proximity switch assembly includes a proximity sensor comprising a first electrode comprising first fingers and a second electrode comprising second fingers, wherein the first and second fingers are interdigitated with a variable density along a first direction. The proximity switch assembly also includes control circuitry processing a signal in response to a user activation of the proximity sensor and determining sliding activation of the sensor in the first direction.

According to a further aspect of the present invention, a method of activating a proximity switch assembly is provided. The method includes the step of providing a proximity sensor comprising a first electrode comprising first fingers and a second electrode comprising second fingers such that the first and second fingers are interdigitated with a varying density along a first direction. The method also includes the steps of processing a signal in response to a user activation of the proximity sensor, and determining sliding activation of the proximity sensor in the first direction based on the processed signal.

These and other aspects, objects, and features of the present invention will be understood and appreciated by those skilled in the art upon studying the following specification, claims, and appended drawings.

BRIEF DESCRIPTION OF THE DRAWINGS

In the drawings:

FIG. 12 is a flow diagram illustrating the subroutine of processing timing pad2 in the routine of FIG. 11;

FIG. 13 is a flow diagram illustrating the subroutine of processing the timing pad1 in the routine of FIG. 11;

FIG. 14 is a flow diagram illustrating the subroutine of processing pad1 to pad2 in the routine of FIG. 11;

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
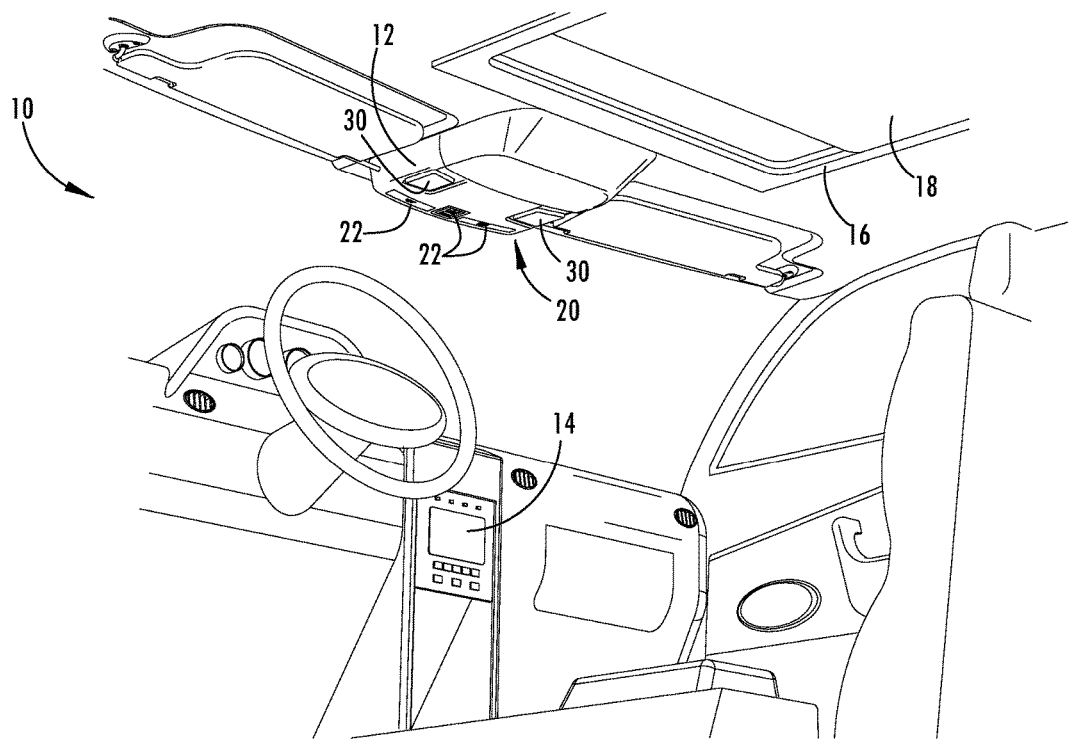
FIG. 1 is a perspective view of a passenger compartment of an automotive vehicle having an overhead console employing a proximity switch assembly, according to one embodiment.
Figure 2:
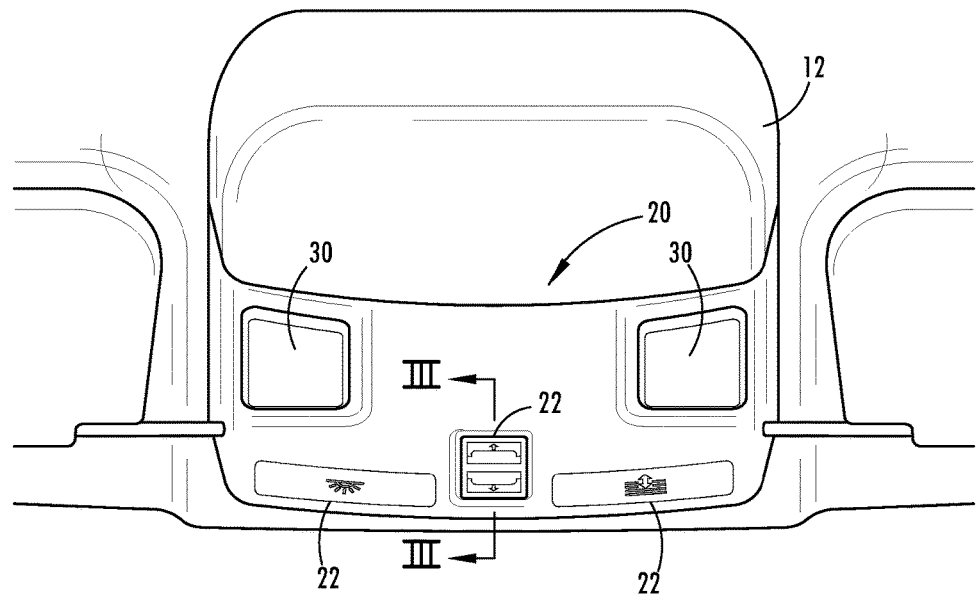
FIG. 2 is an enlarged view of the overhead console and proximity switch assembly shown in FIG. 1.

Referring to FIGS. 1 and 2, the interior of an automotive vehicle 10 is generally illustrated having a passenger compartment and a proximity switch assembly 20 employing a plurality of proximity switches 22 having switch activation monitoring and determination, according to one embodiment. The vehicle 10 generally includes an overhead console 12 assembled to the headliner on the underside of the roof or ceiling at the top of the vehicle passenger compartment, generally above the front passenger seating area. The switch assembly 20 has a plurality of proximity switches 22 arranged in the overhead console 12, according to the embodiment shown. However, it should be appreciated that one or more proximity switches 22 may be used in the switch assembly 20. The various proximity switches 22 may control any of a number of vehicle devices and functions, such as controlling movement of a sunroof or moonroof 16, controlling movement of a moonroof shade 18, controlling activation of one or more lighting devices such as interior map/reading and dome lights 30, and various other devices and functions located on or off a vehicle. However, it should be appreciated that the proximity switches 22 may be located elsewhere on the vehicle 10, such as in the dash panel, on other consoles such as a center console, integrated into a touch screen display 14 for a radio or infotainment system such as a navigation and/or audio display, or located elsewhere onboard the vehicle 10 according to various vehicle applications.

The proximity switches 22 are shown and described herein as capacitive switches, according to one embodiment. Each proximity switch 22 includes at least one proximity sensor that provides a sense activation field to sense contact or close proximity (e.g., within one millimeter) of a user in relation to the one or more proximity sensors, such as a tap, a stable press or a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIGS. 1 and 2 each provide control of one or more vehicle components or devices or provide one or more designated control functions. One or more of the proximity switches 22 may be dedicated to controlling movement of a sunroof or moonroof 16 so as to cause the moonroof 16 to move in an open or closed direction, tilt the moonroof, or stop movement of the moonroof based upon a control algorithm. One or more other proximity switches 22 may be dedicated to controlling movement of a moonroof shade 18 between open and closed positions. Each of the moonroof 16 and shade 18 may be actuated by an electric motor in response to actuation of the corresponding proximity switch 22. Other proximity switches 22 may be dedicated to controlling other devices, such as turning an interior map/reading light 30 on, turning an interior map/reading light 30 off, turning a dome lamp on or off, unlocking a trunk, opening a rear hatch, or defeating a door light switch. Additional controls via the proximity switches 22 may include actuating door power windows up and down. Various other vehicle and non-vehicle controls may be controlled by use of the proximity switches 22 described herein.

Figure 3:
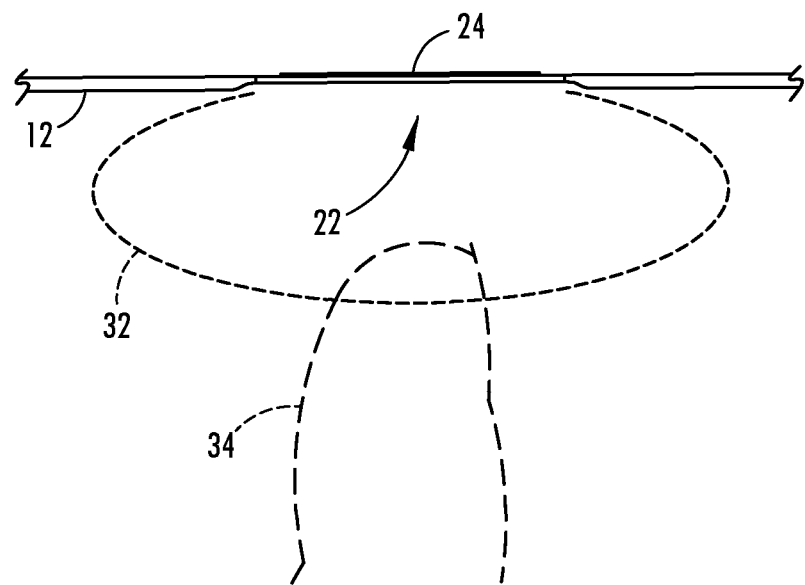
FIG. 3 is an enlarged cross-sectional view taken through line III-III in FIG. 2 showing a proximity switch in relation to a user's finger.
Figure 4:
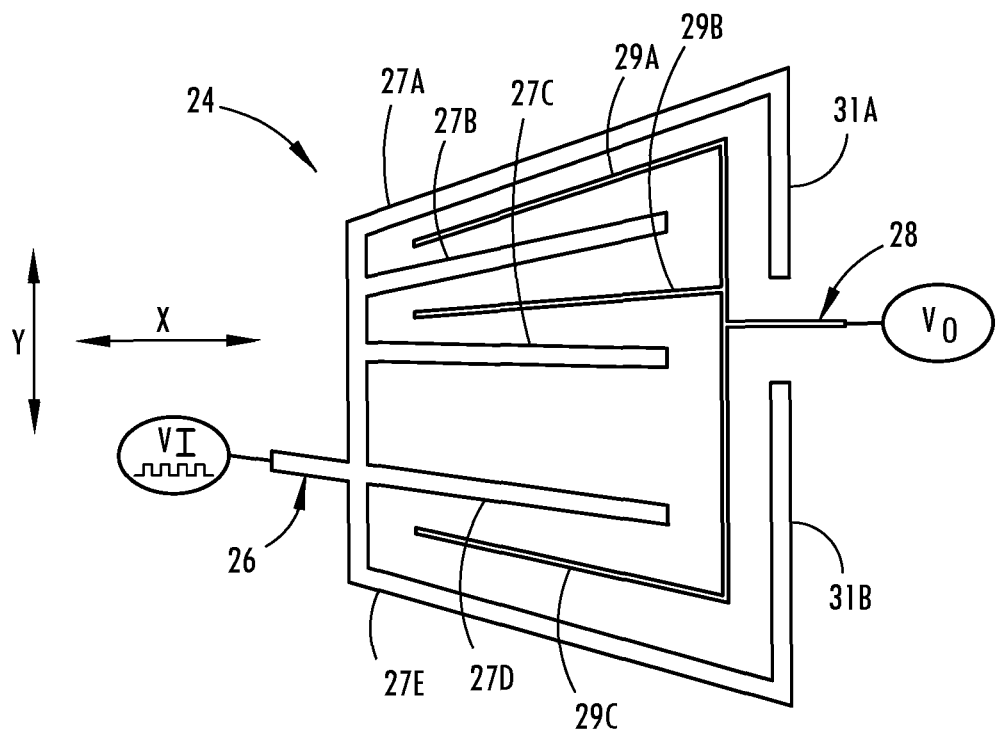
FIG. 4 is a schematic diagram of a capacitive sensor employed in each of the capacitive switches shown in FIG. 3, according to one embodiment.

Referring to FIG. 3, a portion of the proximity switch assembly 20 is illustrated having a proximity switch 22 in relation to a user's finger 34 during use of the switch assembly 20. The proximity switch 22 may include one or more proximity sensors 24 for generating a sense activation field. According to one embodiment, each of the proximity sensors 24 may be formed by printing conductive ink onto the top surface of the polymeric overhead console 12. One example of a proximity sensor 24 is shown in FIG. 4 generally having a drive electrode 26 and a receive electrode 28 each having interdigitated fingers for generating a capacitive field 32. It should be appreciated that each of the proximity sensors 24 may be otherwise formed such as by assembling a preformed conductive circuit trace onto a substrate according to other embodiments. The drive electrode 26 receives square wave drive pulses applied at voltage $V_I$. The receive electrode 28 has an output for generating an output voltage $V_O$. It should be appreciated that the drive and receive electrodes 26 and 28 may be arranged in various other configurations for generating the capacitive field as the activation field 32. The drive electrode 26 includes a plurality of electrode fingers 27A-27E each generally illustrated extending at a different angle relative to the horizontal axis. The receive electrode 28 includes a plurality of electrode fingers 29A-29C each likewise extending at different angles relative to the horizontal axis. The first and second plurality of fingers 27A-27E and 29A-29C are interdigitated with one another and have a variable or varying spacing therebetween at different locations along a first direction X parallel to the horizontal axis. It should be appreciated that the drive and receive electrode fingers 27A-27E and 29A-29C have a density that varies along the first direction, such as along the horizontal axis. The sensor arrangement advantageously allows for detection of an activation by a user's finger along a first direction, such as a horizontal axis, and a second direction Y orthogonal to the first direction, such as a vertical axis. This is because a user's finger interacts with a greater number of electrode fingers on one side of the sensor 24 as opposed to the opposite side, thereby enabling processing of the sensor signals to determine a sliding or swipe motion of the finger interfacing with the sensor 24. In addition, a diagonal sliding of the finger and a tap or stable press of the finger can also be detected as described herein.

In the embodiment shown and described herein, the drive electrode 26 of each proximity sensor 24 is applied with voltage input $V_I$ as square wave pulses having a charge pulse cycle sufficient to charge the receive electrode 28 to a desired voltage. The receive electrode 28 thereby serves as a measurement electrode. When a user or operator, such as the user's finger 34, enters an activation field 32, the proximity switch assembly 20 detects the disturbance caused by the finger 34 to the activation field 32 and determines whether the disturbance is sufficient to activate the corresponding proximity switch 22. The disturbance of the activation field 32 is detected by processing the charge pulse signal associated with the corresponding signal channel. Each proximity switch 22 has its own dedicated signal channel generating charge pulse counts which is processed as discussed herein.

Figure 5:
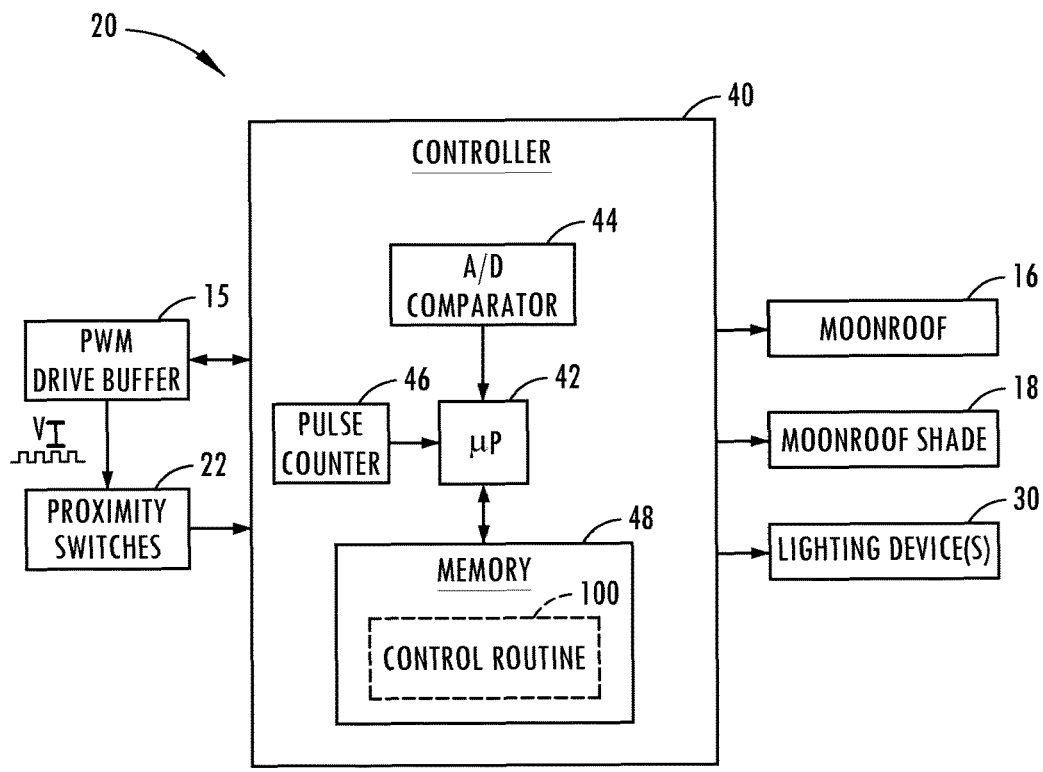
FIG. 5 is a block diagram illustrating the proximity switch assembly, according to one embodiment.

Referring to FIG. 5, the proximity switch assembly 20 is illustrated according to one embodiment. A plurality of proximity sensors 24 are shown providing inputs to a controller 40, such as a microcontroller. The controller 40 may include control circuitry, such as a microprocessor 42 and memory 48. The control circuitry may include sense control circuitry processing the activation field of each sensor 22 to sense user activation of the corresponding switch by comparing the activation field signal to one or more thresholds pursuant to one or more control routines. It should be appreciated that other analog and/or digital control circuitry may be employed to process each activation field, determine user activation, and initiate an action. The controller 40 may employ a QMatrix acquisition method available by ATMEL®, according to one embodiment. The ATMEL acquisition method employs a WINDOWS® host C/C++ compiler and debugger WinAVR to simplify development and testing the utility Hawkeye that allows monitoring in real-time the internal state of critical variables in the software as well as collecting logs of data for post-processing.

The controller 40 provides an output signal to one or more devices that are configured to perform dedicated actions responsive to detected activation of a proximity switch. For example, the one or more devices may include a moonroof 16 having a motor to move the moonroof panel between open, closed and tilt positions, a moonroof shade 18 that moves between open and closed positions, and lighting devices 30 that may be turned on and off. Other devices may be controlled such as a radio for performing on and off functions, volume control, scanning, and other types of devices for performing other dedicated functions. One of the proximity switches 22 may be dedicated to actuating the moonroof closed in response to a swipe in a first direction, and actuating the moonroof open in response to a swipe in the opposite second direction, actuating the moonroof to a tilt position in response to a swipe in a third direction orthogonal to the first and second directions, and stopping movement of the moonroof in response to a tap or stable press. The moonroof shade 18 may be opened and closed in response to another proximity switch 22 responsive to swipes in opposite directions. A motor may actuate the moonroof or shade to a desired position in response to the type of activation.

The controller 40 is further shown having an analog to digital (A/D) comparator 44 coupled to the microprocessor 42. The A/D comparator 44 receives the voltage output $V_O$ from each of the proximity switches 22, converts the analog signal to a digital signal, and provides the digital signal to the microprocessor 42. Additionally, controller 40 includes a pulse counter 46 coupled to the microprocessor 42. The pulse counter 46 counts the charge signal pulses that are applied to each drive electrode of each proximity sensor, performs a count of the pulses needed to charge the capacitor until the voltage output $V_O$ reaches a predetermined voltage, and provides the count to the microprocessor 42. The pulse count is indicative of the change in capacitance of the corresponding capacitive sensor. The controller 40 is further shown communicating with a pulse width modulated drive buffer 15. The controller 40 provides a pulse width modulated signal to the pulse width modulated drive buffer 15 to generate a square wave pulse train $V_I$ which is applied to each drive electrode of each proximity sensor/switch 22. The controller 40 processes a control routine 100 stored in memory to monitor and make a determination as to activations of one of the proximity switches and supplies output control signals to various controlled devices.

Figure 6:
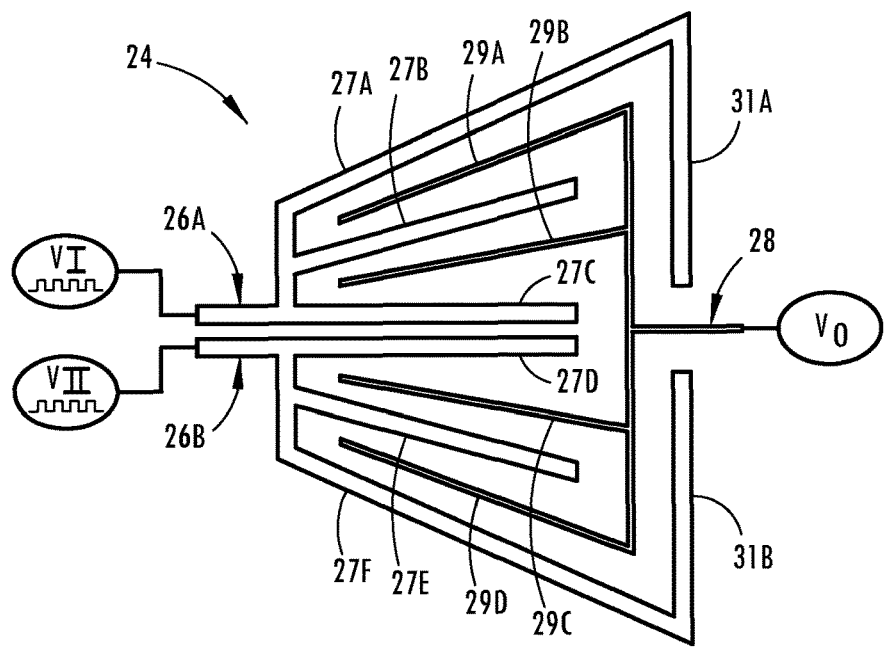
FIG. 6 is a schematic diagram of a capacitive sensor employed in the capacitive switch, according to a first embodiment.

The proximity sensor 24 is shown in FIG. 6 as a capacitive sensor, according to a first embodiment. In this embodiment, the proximity sensor 24 includes a first receive electrode 28 having a first plurality of capacitive fingers 29A-29D. The first fingers 29A-29D extend outward at different angles relative to the horizontal axis and are coupled to the signal output $V_O$. The capacitive sensor 24 also includes second and third drive electrodes 26A and 26B. The second electrode 26A includes a plurality of second capacitive fingers 27A-27C, each of which extends outward at differing angles relative to the horizontal axis. The third electrode 26B includes a plurality of capacitive fingers 27D-27F, each of which extends outward at differing angles relative to the horizontal axis. The second and third electrodes 26A and 26B are generally aligned along the horizontal axis, while the first electrode 28 is likewise generally aligned along the horizontal axis so that the electrode fingers are interdigitated such that fingers on a drive electrode extend between and capacitively couple with opposing fingers on the receive electrode. The second electrode 26A further includes a vertically extending outer finger 31A extending generally perpendicular to the horizontal axis to partially surround a portion of the first electrode 28. The third electrode 26B similarly includes a vertically extending outer finger 26B extending perpendicular to the horizontal axis to partially surround a portion of the first electrode 28. As a result of this electrode configuration, the second and third fingers 27A-27F are interdigitated with the first fingers 29A-29D and have a variable density along the first direction which is parallel to the horizontal axis. As such, as a user's finger slides from the left side to the right side as seen in FIG. 6, the density of the electrode fingers interfacing with the finger goes from a higher density to a lower density which, with a given size finger interfacing therewith, corresponds to a higher signal dropping to a lower signal. Contrarily, a sliding of a user's finger from the right side to the left side causes the user's finger to interface with a low density of capacitive fingers increasing to a high density of capacitive fingers, corresponding to a signal that increases. As such, a sliding motion or swipe of the user's finger from the left to the right or the right to the left may be detected by processing the signals generated by the sensor and monitoring the rate of change of the signals relative to a threshold and/or peak value for a horizontal swipe, as described herein. The proximity sensor 24 may also detect a vertical swipe from top to bottom or bottom to top by processing the signals generated across each of the second and third electrodes 26A and 26B. By knowing that the user's finger is passing from the top second electrode 26A to the bottom third electrode 26B, the assembly can identify a top to bottom swipe. Contrarily, by identifying a signal on the bottom third electrode 26B prior to the top second electrode 26A, a bottom to top swipe may be identified. Further, a diagonal swipe between top left and bottom right and between bottom left and top right may also be detected.

In FIGS. 7-10, the change in sensor charge pulse counts shown as Δ Sensor Count for signal channels associated with proximity switch 22 employing the proximity sensor 24 shown in FIG. 6, is illustrated according to various examples. The change in sensor charge pulse count is the difference between an initialized referenced count value without any finger or other object present in the activation field and the corresponding sensor reading. In these examples, the user's finger enters and interacts with the activation field 32 associated with the proximity switch 22 as the user's finger moves across the sensor 24. The signal channel is the change (Δ) in sensor charge pulse count associated with the capacitive sensor 24. In the disclosed embodiment, the proximity sensors 24 are capacitive sensors. When a user's finger is in contact with or close proximity of a sensor 24, the finger alters the capacitance measured at the corresponding sensor 24. The capacitance is in parallel to the untouched sensor pad parasitic capacitance, and as such, measures as an offset. The user or operator induced capacitance is proportional to the user's finger or other body part dielectric constant, the surface exposed to the capacitive pad, and is inversely proportional to the distance of the user's limb to the switch button. According to one embodiment, each sensor is excited with a train of voltage pulses via pulse width modulation (PWM) electronics until the sensor is charged up to a set voltage potential. Such an acquisition method charges the receive electrode 28 to a known voltage potential. The cycle is repeated until the voltage across the measurement capacitor reaches a predetermined voltage. Placing a user's finger on the touch surface of the switch 24 introduces external capacitance that increases the amount of charge transferred each cycle, thereby reducing the total number of cycles required for the measurement capacitance to reach the predetermined voltage. The user's finger causes the change in sensor charge pulse count to increase since this value is based on the initialized reference count minus the sensor reading.

The proximity switch assembly 20 is able to recognize the user's hand motion when the hand, particularly a finger, is in close proximity to the proximity switch 22, to discriminate whether the intent of the user is to activate a switch 22 with a tap or stable press activation or perform a sliding activation also referred to as a swipe. The proximity sensor 24 shown in FIG. 6 allows the proximity switch assembly 20 to differentiate between and determine a stable press, a fast tap, and a swipe across the sensor. The sensor geometry and control circuitry also enables the proximity switch assembly 10 to detect the direction of the swipe, whether the swipe is a left-to-right swipe, a right-to-left swipe, a top-to-bottom swipe, a bottom-to-top swipe, or a diagonal swipe extending in a direction between the horizontal and vertical axes. A stable press generally requires the signal generated across both the second and third electrodes 26A and 26B to be stable for a predetermined time range. A fast tap generally requires a symmetrical rise and fall of the signal across the peak value to happen in a short time range. A slide across the sensor or pad can be recognized by analyzing the slope of the rise and fall of the electrode signals and their relative timing.

If a sliding activation is detected, the following steps generally occur. The rise and fall timing of both signals associated with the second and third electrodes 26A and 26B also referred to as pad1 and pad2 is determined. The offset timing of the second and third electrode signals is also determined. A motion of left-to-right, right-to-left or neither across both pad1 and pad2 is determined. Motion from the top second electrode 26A to the bottom third electrode 26B or from the bottom third electrode 26B to the top second electrode 26A is determined. The data is combined and processed to determine the overall swipe direction.

Figure 7:
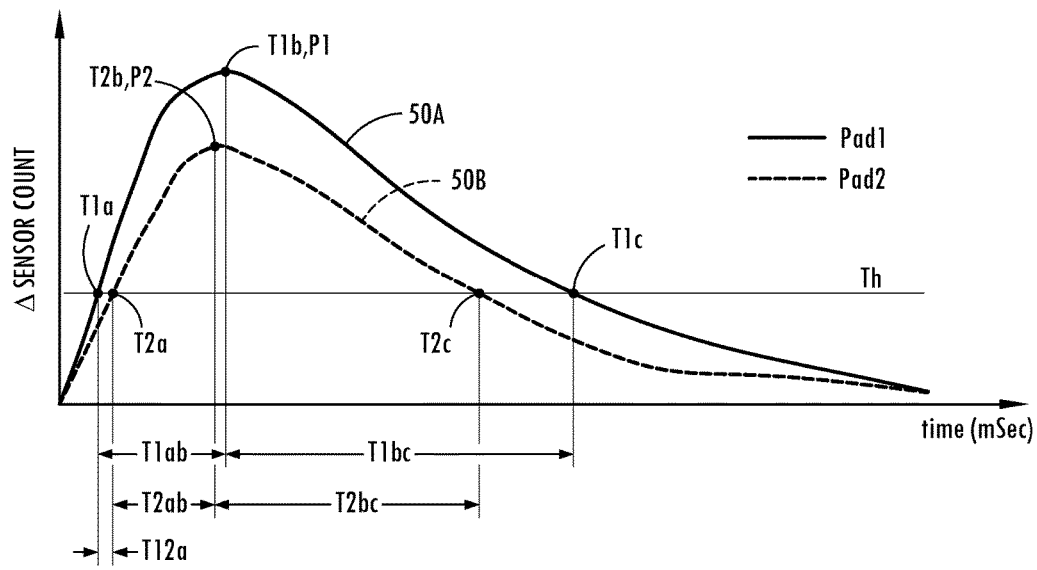
FIG. 7 is a graph illustrating the Δ (delta) sensor count for a signal associated with the capacitive sensor of FIG. 6 during a horizontal left-to-right swipe.

In FIG. 7, signals 50A and 50B generated across the second and third electrodes 26A and 26B, respectively, are generally illustrated during a left-to-right swipe activation. Pad1 is referred to as the signal generated by the second electrode 26A in relation to the first electrode 28. Pad2 is referred to as the signal generated by the third electrode 26B in relation to the first electrode 28. Both signals across pad1 and pad2 are shown rising up and crossing a threshold Th at times T1$a$ and T2$a$, and further rising up at a first rate to peak values P1 and P2 at times T1$b$ and T2$b$, respectively. The signals 50A and 50B on each of pad1 and pad2 then decrease at a lower second rate generally along a ramp to the threshold value Th at times T1$c$ and T2$c$, respectfully. Time values T1$a$, T1$b$ and T1$c$ are the time periods at which the signal on pad1 crosses the threshold Th while rising, reaches the peak value and crosses the threshold Th while decreasing towards zero. Time values T2$a$, T2$b$ and T2$c$ are the time values for pad2 at which the signal crosses the threshold Th while rising, reaches the peak value, and thereafter crosses the threshold Th while decreasing towards zero. When the user's finger interfaces with the electrodes on the left side of the switch, the signal rises up more quickly due to the higher density and closer spacing of the interdigitated electrode capacitive fingers. As the finger moves from the left to the right and approaches the right side of the sensor, the signal decreases due to the lower density and greater spacing between the capacitive electrode fingers while the user's finger travels in a first direction along the horizontal axis.

Figure 8:
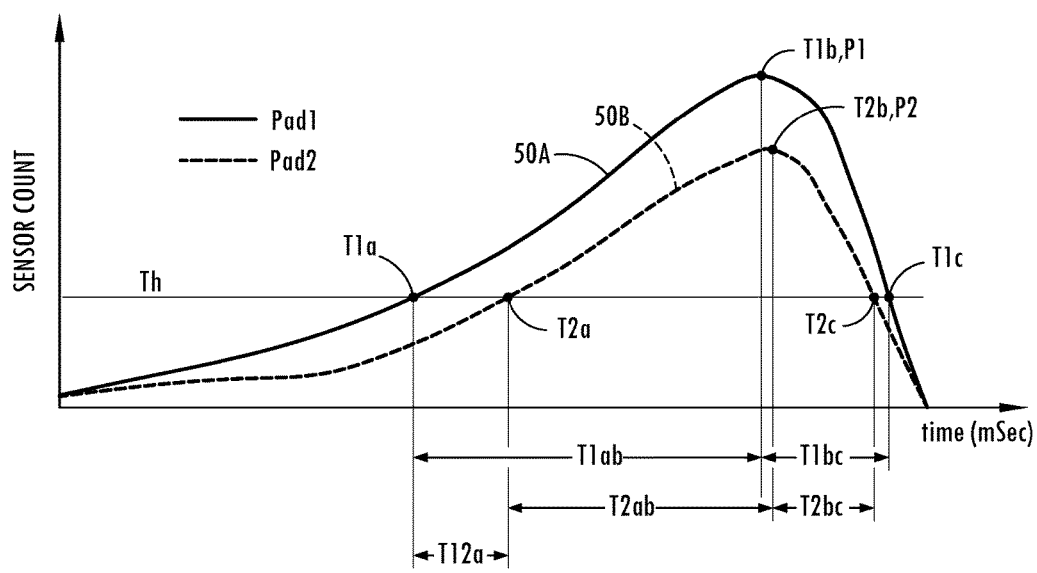
FIG. 8 is a graph illustrating the Δ sensor count for the signal associated with the capacitive sensor shown in FIG. 6 for a horizontal right-to-left swipe.

A swipe activation from the right side to the left side is illustrated in FIG. 8 in which the signals associated with the second and third electrodes 26A and 26B relative to the first electrode rise up, cross the threshold Th, rise at a first rate to peak values P1 and P2 at times T1$b$ and T2$b$ and then drop at a greater second rate back to the threshold Th at times T1$c$ and T2$c$, respectively. In this example, the signal rise at the first rate is slower than the decreasing second rate on the right side of the sensor due to the lower density of interdigitated electrode capacitive fingers and greater spacing of the capacitive fingers along the horizontal axis. The lower density and greater spacing between capacitively coupled fingers results in fewer capacitive fingers interfacing with the user's finger which results in a weaker signal.

Figure 9:
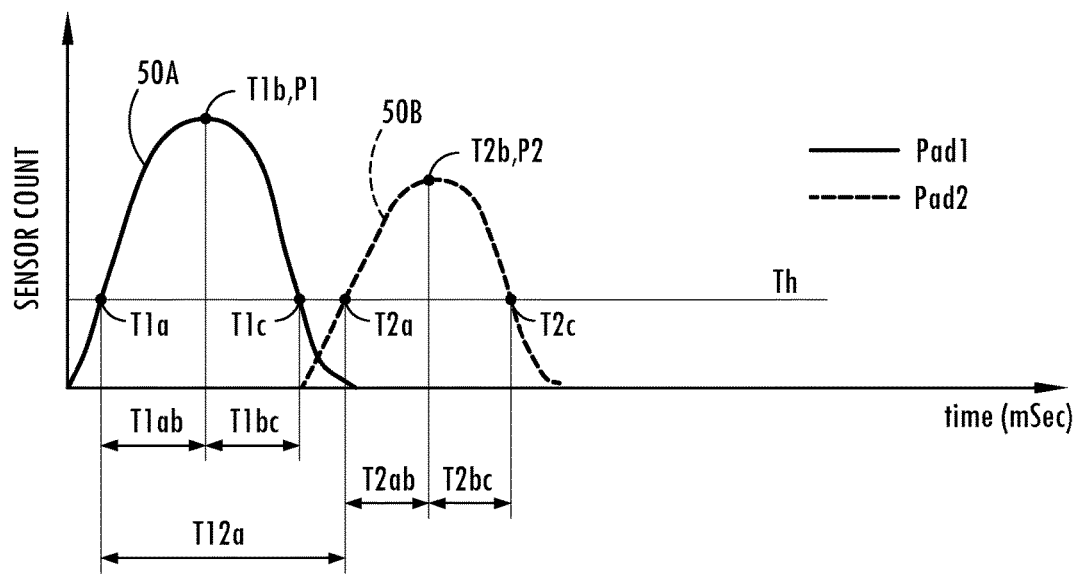
FIG. 9 is a graph illustrating a Δ sensor count for a signal associated with the capacitive sensor shown in FIG. 6 for a vertical top-to-bottom swipe.

The electrode signals for a top-to-bottom sliding activation are illustrated in FIG. 9, according to one example. In this example, the signal 50A associated with the top second electrode 26A is shown rising up and crossing the threshold Th, reaching a peak value P1 at time T1$b$ and dropping back to the threshold Th at time T1$c$, prior to any significant activation of the lower third electrode 26B. The lower third electrode 26B generates a time-delayed signal 50B that rises up, crosses the threshold Th, reaches a peak value P2 at time T2$b$, and then drops back down to the threshold value Th at time T2$c$. The signal 50A associated with the second electrode 26A thus rises up, reaches a peak value and drops before the signal 50B associated with the third electrode 26B rises up and drops. As a result, the proximity switch assembly 20 detects activation of the top second electrode 28A prior to detecting activation of the bottom third electrode 28B in a time sequence such that a top-to-bottom sliding activation is detected. It should be appreciated that a bottom-to-top sliding activation may be detected by reversing the signals 50A and 50B such that signal 50B is likewise generated first in time prior to signal 50A.

Figure 10:
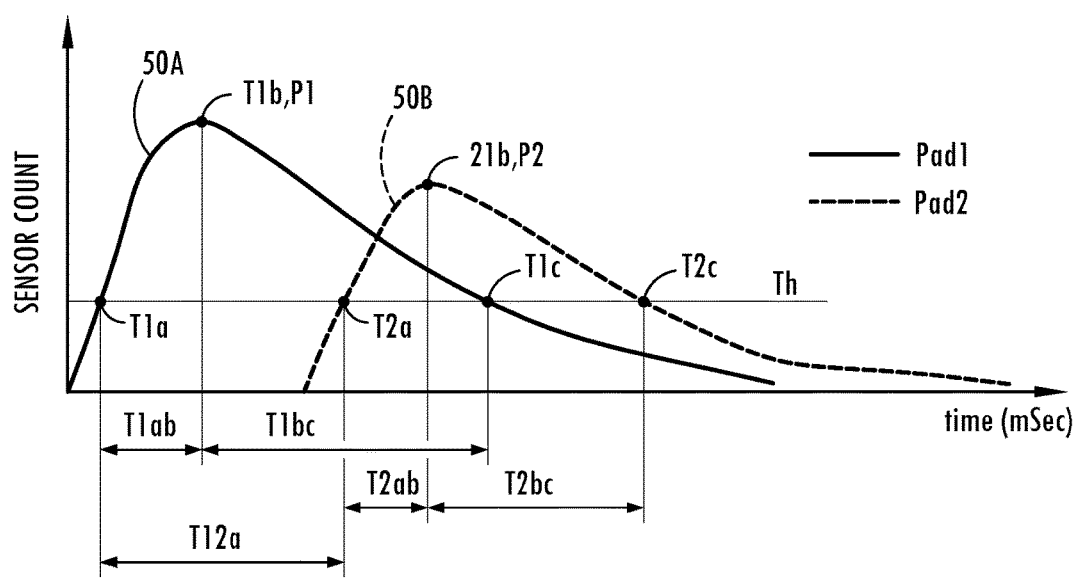
FIG. 10 is a graph illustrating the Δ sensor count for a signal associated with the capacitive sensor of FIG. 6 showing a diagonal top-left-to-bottom-right swipe.

The proximity switch assembly 20 is further configured to detect a diagonal swipe activation such as a top left to bottom right activation as shown in FIG. 10. In this example, the signal 50A associated with the second electrode 26A (pad1) rises up to threshold Th, further rises up at a steep higher first rate to a maximum value P1 at time T1$b$, and more slowly drops back down at a lower second rate to the threshold value Th at time T1$c$. Prior to signal 50A dropping below threshold Th, the signal 50B associated with the third electrode 26B rises up and crosses threshold Th. The signal 50B further rises up to a peak value P2 at time T1$b$ and slowly drops at a slower rate back down to threshold value Th at time T2$c$. The proximity switch assembly 20 determines a top left to bottom right sliding activation of the switch 22 based on the timing of the signal 50B being delayed by T12$a$ compared to signal 50A, and rise time T1$ab$ and T2$ab$ being significantly shorter than fall time T1$bc$ and T2$bc$. It should further be appreciated that a bottom left to top right sliding activation may be detected by reversing the signals 50A and 50B in time sequence such that signal 50B likewise occurs before signal 50A. It should further be appreciated that a top right to bottom left diagonal sliding activation may be detected and that a bottom right to top left sliding activation may be detected by processing the signals rates, peak values, and timing relative to each other.

Figure 11:
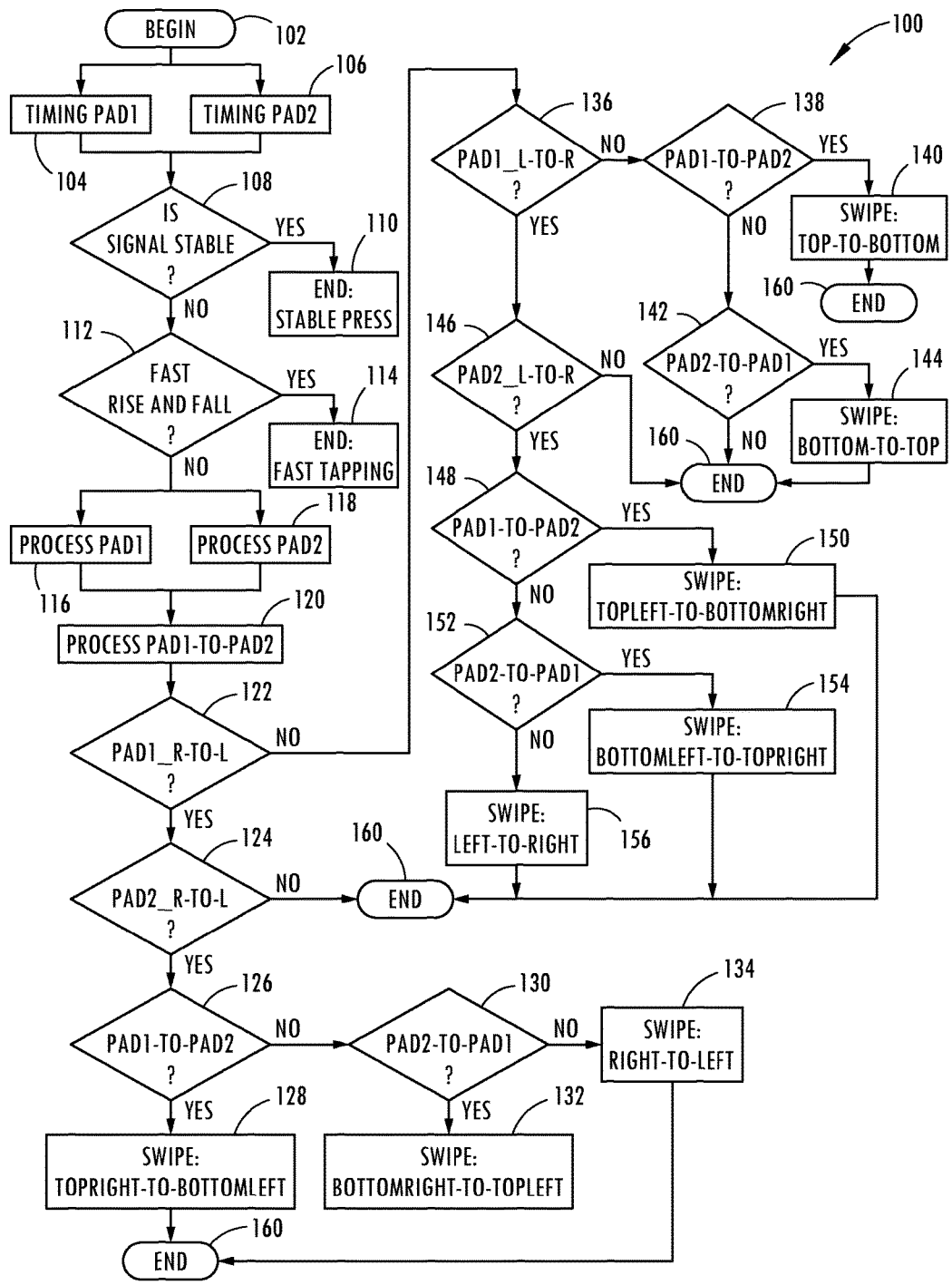
FIG. 11 is a flow diagram illustrating a routine for processing and determining activation of the switch assembly employing the sensor shown in FIG. 6.

Referring to FIG. 11, a routine 100 for processing the electrode signals and determining activation of the proximity sensor shown in FIG. 6 is illustrated, according to one embodiment. Routine 100 may be executed by control circuitry such as controller 40. Routine 100 begins at step 102 and proceeds to execute subroutines 104 and 106 to determine the signals associated with each of the second and third electrodes which are also referred to herein as pad1 and pad2, respectively. Subroutines 104 and 106 may be executed at the same time and may be repeatedly executed.

The subroutine 104 is illustrated in FIG. 12 beginning at step 162 and proceeding to step 164 to identify the timing of pad1 signal crossing threshold Th on a rising slope at time T1$a$. Next, at step 166, subroutine 104 identifies the timing at time T1$b$ and the intensity P1 of pad1 signal peak value. Next, at step 168, subroutine 104 identifies the timing of the pad1 signal crossing threshold Th on a falling slope at time T1$c$, before ending at step 170.

The subroutine 106 is shown in FIG. 13 beginning at step 172 and proceeding to step 174 to identify the timing of the pad2 signal crossing threshold Th on a rising slope at time T2$a$. Next, subroutine 106 identifies the timing at time T2$b$ and intensity P2 of the pad2 signal peak value. Finally, subroutine 106 identifies the timing of pad2 signal crossing threshold Th on a falling slope at time T2$c$, before ending at step 180.

Following subroutines 104 and 106, routine 100 proceeds to decision step 108 to determine if each of the signals on both pad1 and pad 2 is stable and, if so, determines that a stable press activation, and then ends at step 110. A stable press activation may be used to output a designated control function. If the signals associated with pad1 and pad2 are not stable, routine 100 proceeds to decision step 112 to determine if the signals experience a fast rise at a first high rate (delta counts/time) followed quickly by a fast fall at a second high rate and, if so, determines a fast tapping activation. The fast tapping activation may result in an output signal to perform a designated control function. If the signals do not rise fast and then fall fast, routine 100 proceeds to subroutines 116 and 118 to process the signals associated with each of pad1 and pad2.

Figure 15:
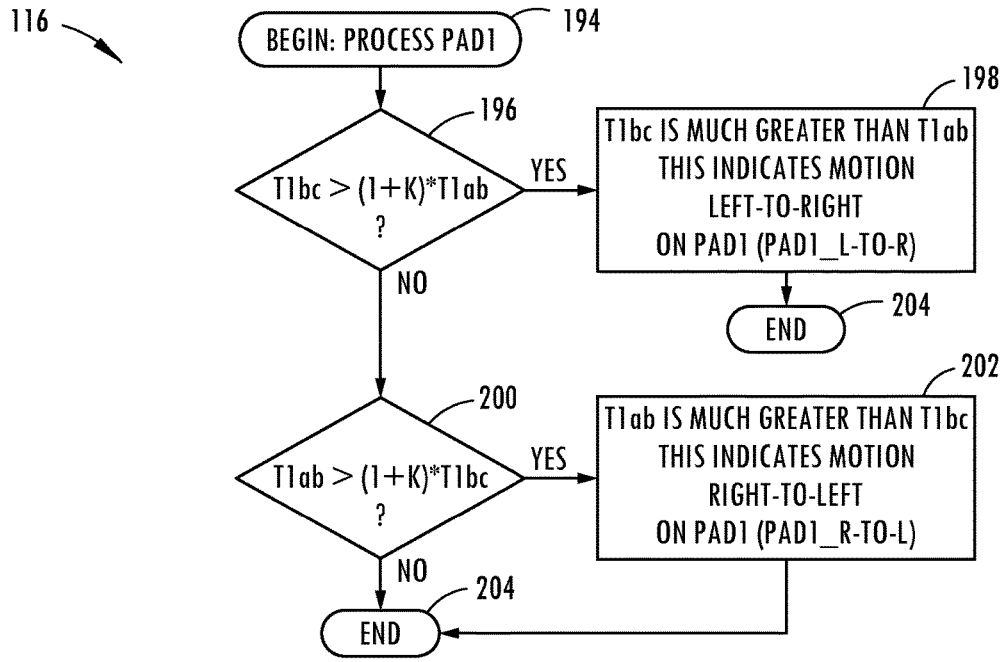
FIG. 15 is a flow diagram illustrating the subroutine of processing pad1 in the routine of FIG. 11.

The process pad1 subroutine 116 is illustrated in FIG. 15 beginning at step 194 and proceeding to decision step 196 to determine if time T1$bc$ is greater than the quantity (1+K)× T2$ab$, wherein K is a constant greater than zero. If yes, subroutine 116 proceeds to step 198 to determine that time T2$bc$ is much greater than time T2$ab$ which occurs when the signal rise is faster than the signal fall as seen in FIG. 7, indicative of motion from left-to-right on pad1, before ending at step 204. If the output of decision step 196 is negative, subroutine 116 proceeds to decision step 200 to determine if time T2$ab$ is greater than the sum (1+K)×T2$bc$ and, if yes, proceeds to step 202 to determine that time T2$ab$ is much greater than time T2$bc$ which occurs when the signal rise is slower than the signal fall as seen in FIG. 8, indicative of motion from right-to-left on pad1, before ending at step 204.

Figure 16:
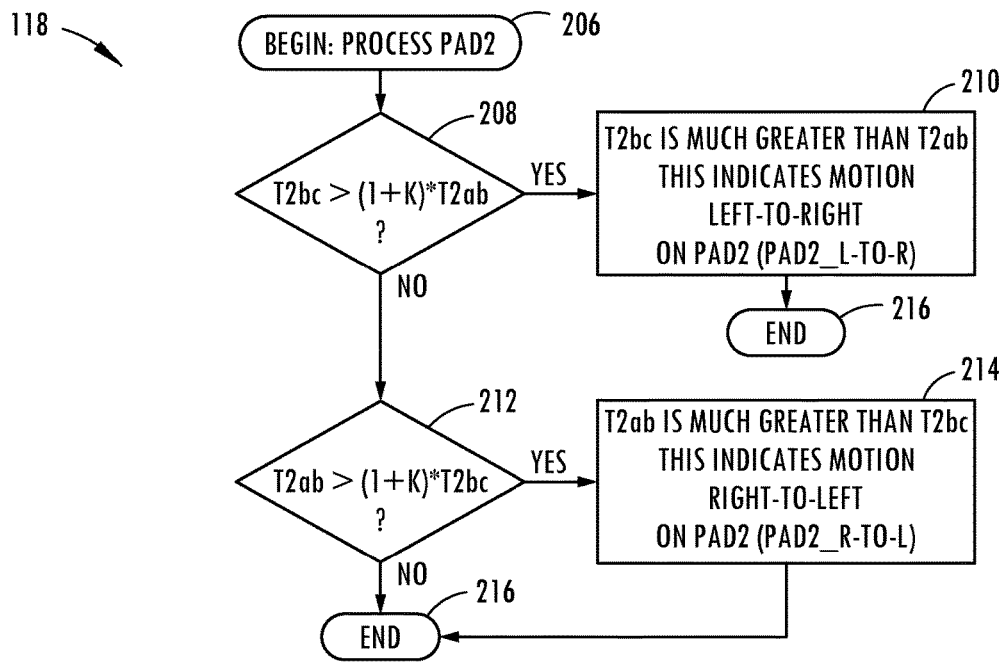
FIG. 16 is a flow diagram illustrating the subroutine of processing pad2 in the routine of FIG. 11.

The process pad2 subroutine 118 is illustrated in FIG. 16 beginning at step 206 and proceeding to decision step 208 to determine if time T1$bc$ is greater than the quantity (1+K)× T2$ab$, wherein K is a constant. If yes, subroutine 208 proceeds to step 210 to determine that time T2$bc$ is much greater than time T2$ab$ which occurs when the signal rise is faster than the signal fall as seen in FIG. 7, indicative of motion from left-to-right on pad2, before ending at step 216. If the output of decision step 208 is negative, subroutine 116 proceeds to decision step 212 to determine if time T2$ab$ is greater than the sum (1+K)×T2$bc$ and, if yes, proceeds to step 214 to determine that time T2$ab$ is much greater than time T2$bc$ which occurs when the signal rise is slower than the signal fall as seen in FIG. 8, indicative of motion from right-to-left on pad2, before ending at step 216. Following execution of the subroutines 116 and 118, routine 100 proceeds to step 120 to process a pad1-to-pad2 subroutine shown in FIG. 14 which determines whether the pad are swept together, as in a horizontal swipe, or one after the other, as in a vertical swipe. Subroutine 120 begins at step 182 and proceeds to determine if pad1 is engaged before checking whether T1$a$<T2$a$, with pad 2 engaged after the peak on pad1 is reached, which is determined when T12$a$≥T1$ab$ and, if so, determines that there is top to bottom motion from pad1 to pad2 at step 186, prior to ending at step 192. If decision step 184 is negative, subroutine 120 proceeds to decision step 188 to determine if pad2 is engaged before pad1 by checking whether T2$a$<T1$a$, with pad1 engaged after the peak on pad2 is reached, which is determined when T21$a$>T2$ab$, and, if so, determines there is bottom to top motion from pad2 to pad1 at step 190, before ending at step 192.

Following execution of subroutine 120, routine 100 proceeds to decision step 122 to determine if a right-to-left swipe on pad1 is detected and, if so, proceeds to decision step 124 to determine if a right-to-left swipe is detected on pad2. If a right-to-left swipe is detected on both pad1 and pad2, routine 100 proceeds to decision step 126 to determine if a top to bottom vertical swipe component from pad1 to pad2 is detected and, if so, determines that the swipe activation is a diagonal top right to bottom left activation at step 120 before ending at step 160. If decision step 126 determines that the activation is not a top to bottom pad1-to-pad2 motion, routine 100 proceeds to decision step 130 to determine if the motion is a bottom to top pad2-to-pad1 motion and, if so, determines the swipe activation is a diagonal bottom right to top left activation at step 132 before ending at step 160. If decision step 130 determines that the activation is not a bottom to top pad2-to-pad1 motion, routine 100 proceeds to step 134 to determine that the swipe activation is a right-to-left swipe activation, before ending at step 160.

Returning to decision step 122, if a pad1 right-to-left motion is not detected, routine 100 proceeds to decision step 136 to determine if the pad1 motion is a left-to-right motion and, if so proceeds to decision step 146 to determine if the pad2 motion is a left-to-right motion and if not, ends at step 160. If the pad2 swipe is a left-to-right motion, routine 100 proceeds to decision step 148 to determine if there is a top to bottom component of motion from pad1 to pad 2 and, if so, determines a swipe activation from the top left to the bottom right at step 150 before ending at step 160. If there is no pad1-to-pad2 motion in step 148, routine 100 proceeds to decision step 152 to determine if there is a bottom to top component of motion from pad2 to pad1 and, if so, determines a swipe activation as a bottom left to top right swipe at step 154 before ending at step 160. If there is neither a motion from pad1 to pad2 or pad2 to pad1 as determined by decision steps 148 and 152, routine 100 proceeds to determine that there is a swipe activation of a left-to-right motion at step 156, before ending at step 160.

If decision step 136 determines that pad1 does not experience a left-to-right motion, routine 100 proceeds to decision 138 to determine if there is a top to bottom motion from pad1 to pad2 and, if so, determines a swipe activation from top-to-bottom at step 140, before ending at step 160. If decision step 138 determines that there is no top to bottom pad1-to-pad2 motion, routine 100 proceeds to decision step 142 to determine if there is a bottom to top motion from pad2 to pad1 and, if so, determines a swipe activation from bottom-to-top at step 144 before ending at step 160.

Accordingly, control routine 100 advantageously determines a tap or stable press activation of the switch 22 as one or two control outputs. Additionally, control routine 100 may determine a left or a right directional swipe and provide control outputs therefore. Further, control 100 may determine upward or downward swipes from top-to-bottom or bottom-to-top for further control outputs. Finally, control routine 100 may determine diagonal swipes, such as from the top right to the bottom left or from the bottom right to the top left and other diagonal movements in a direction along an axis between the horizontal and vertical axes as further control outputs.

Figure 17:
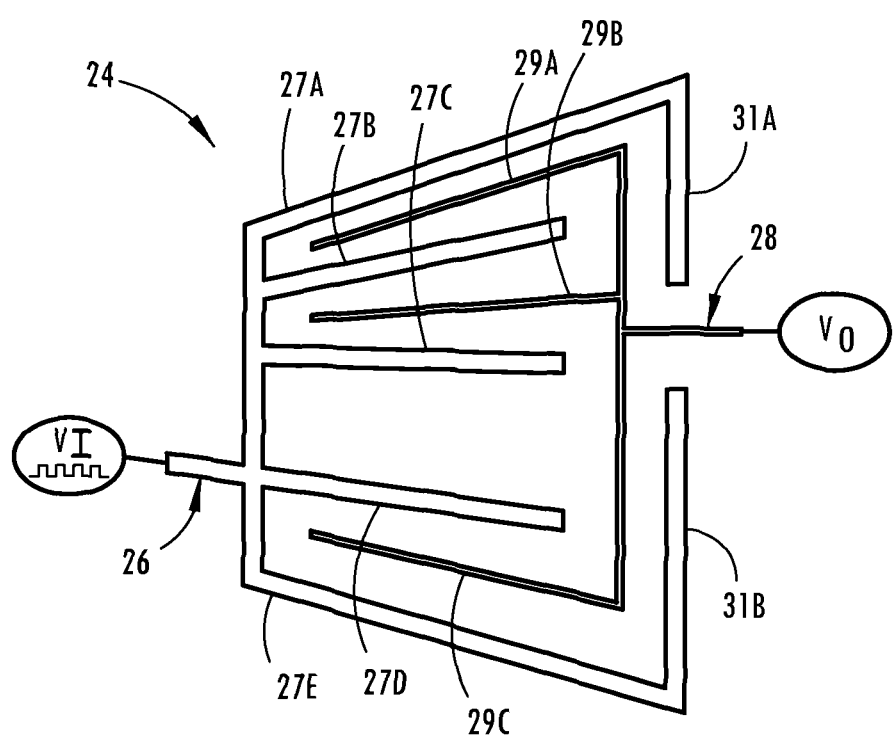
FIG. 17 is a schematic diagram of a capacitive sensor employing a proximity switch, according to a second embodiment.

Referring to FIG. 17, a proximity sensor 24 for use in the proximity switch assembly 20 is illustrated, according to a second embodiment. In this embodiment, a first receive electrode 28 is employed with a second drive electrode 26 whereby the drive electrode 28 generates voltage signal $V_I$ and the receive electrode 28 generates voltage output $V_O$. The first electrode 28 includes a plurality of first capacitive fingers 29A-29C. The second electrode 26 includes a plurality of second capacitive fingers 27A-27E. The first and second capacitive fingers generally oppose each other and many of the first and second capacitive fingers are interdigitated to create a capacitive field relative to one another. The second electrode 26 further includes a first vertical extension 31A that partially surrounds the first electrode and a second vertical extension 31B that likewise partially surrounds the first electrode 28. Each of the capacitive fingers of the first and second electrodes extend outward at an angle relative to the horizontal axis and are interdigitated such as to provide a varying density along the horizontal axis and provide a variable spacing between capacitively coupled fingers along the horizontal axis. In this embodiment, only a single drive electrode 26 is employed as opposed to two drive electrodes as shown and described in connection with the first embodiment. In addition, the first electrode 28 omits a capacitive finger so as to create a different spacing and density amongst the capacitively coupled fingers. The proximity sensor 24 advantageously allows for a fast tap or stable press activation be detected in addition to a horizontal left-to-right or right-to-left motion activation and a vertical top-to-bottom or bottom-to-top activation as described herein.

Figure 18:
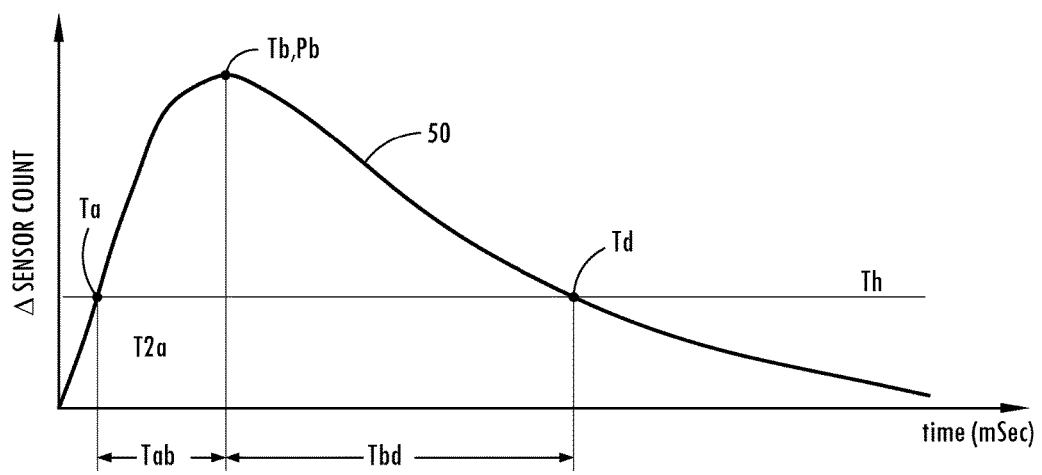
FIG. 18 is a graph illustrating the Δ sensor count for a signal associated with the capacitive sensor shown in FIG. 17 for a horizontal left-to-right swipe.

In FIGS. 18-21, the change in sensor charge pulse counts shown as Δ sensor count for the signal channel associated with the proximity switch 22 employing the proximity sensor 24 shown in FIG. 17 is illustrated, according to various examples. In FIG. 18, signal 50 generated by the second electrode 26 relative to first electrode 28 is generally illustrated during a left-to-right swipe activation. The signal 50 is shown rising up and crossing a threshold Th at time Ta and further rising up at a first rate to a peak value Pb at time Tb before more gradually dropping back down at a slower second rate to the threshold value Th at time Td. Time value Tab represents the time for signal 50 to rise from time Ta to Tb, whereas time Tbd represents a time for signal 50 to fall from time Tb to time Td. When the user's finger interacts with the left side of the sensor 24, a higher density of capacitive fingers and closer spacing between capacitively coupled electrode fingers is present which results in a higher signal, whereas as the user's finger moves from left-to-right, the right side has a lower density of capacitive fingers and greater spacing between capacitively coupled fingers, thereby resulting in a lower signal. As such, control circuitry may determine that a left-to-right swipe motion was activated.

Figure 19:
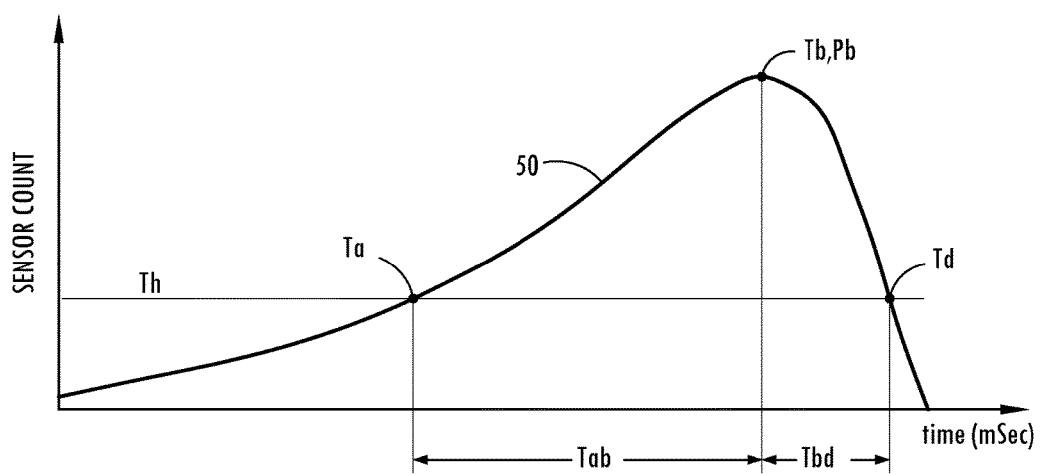
FIG. 19 is a graph illustrating the Δ sensor count for a signal associated with the capacitive sensor shown in FIG. 17 for a horizontal right-to-left swipe.

A swipe activation from the right side to the left side of the sensor 24 is illustrated in FIG. 19 in which the signal associated with the second electrode 26 relative to the first electrode 28 rises up and reaches the threshold Th at time Ta and then further rises up at a first slower rate to a peak value Pb at time Tb before sharply dropping at a higher second rate back down to threshold Th at time Td. In this example, the signal rise is slower on the left side of the sensor as compared to the right side due to the lower density of interdigitated electrode fingers and the greater spacing of the capacitively coupled fingers on the right side along the horizontal axis.

Figure 20:
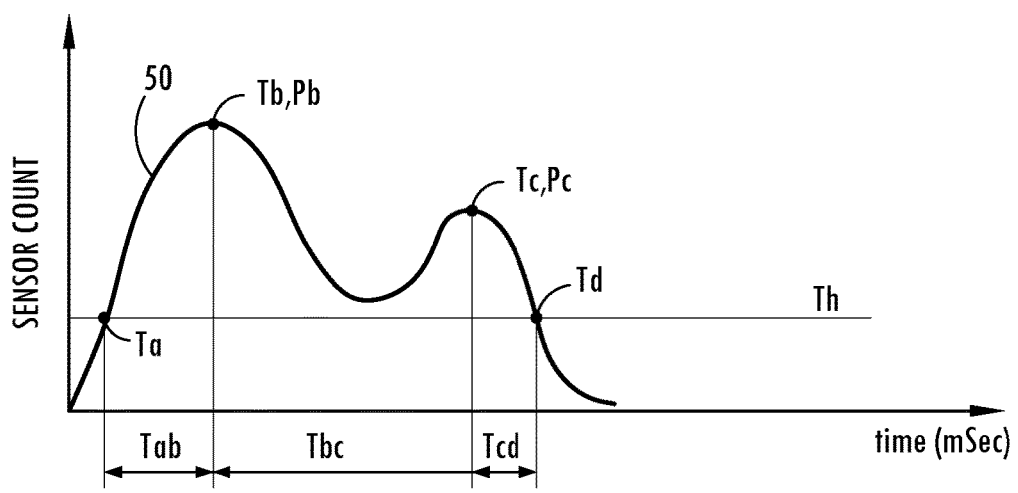
FIG. 20 is a graph illustrating the Δ sensor count for a signal associated with a capacitive sensor shown in FIG. 17 for a vertical top-to-bottom swipe.

A top to bottom activation of the sensor 24 is illustrated in FIG. 20 according to one example. The signal 50 rises up to cross threshold Th at time Ta and then continues to rise to a first peak value Pb at time Tb and then drops to a lower value before rising back up to a second peak value Pc at time Tc. The second peak value Pc is less than the first peak value Pb. The signal 50 thereafter drops to zero. The control circuitry determines that signal 50 is indicative of a top to bottom swipe because the first peak value Pb is higher than the second peak value Pc, and the higher value results because of a higher density of capacitive fingers and closer spacing between capacitively coupled fingers associated with the top portion of the capacitive sensor 24 as compared to the bottom portion of the sensor 24.

Figure 21:
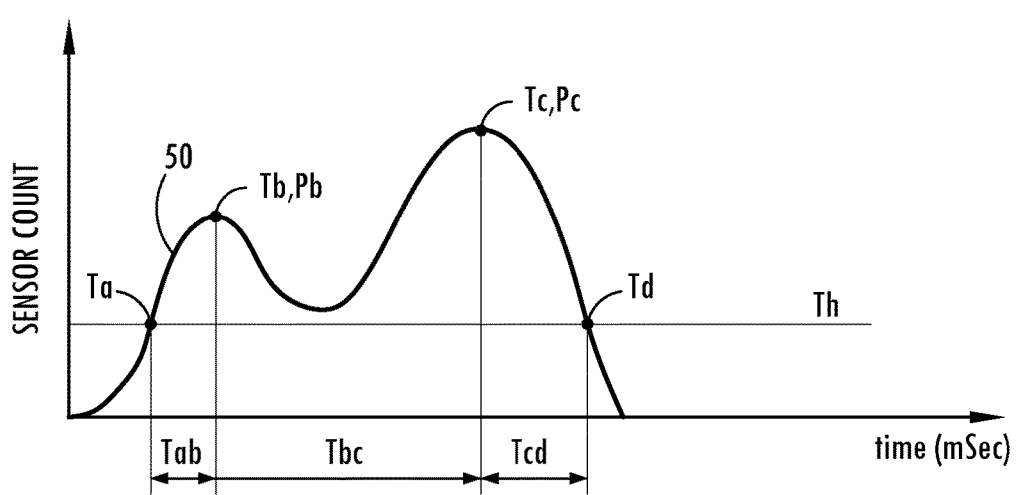
FIG. 21 is a graph illustrating the Δ sensor count for a signal associated with the capacitive sensor shown in FIG. 17 for a vertical bottom-to-top swipe.

A bottom to top activation of the sensor 24 is illustrated in FIG. 21 according to one example. The signal 50 rises up to cross threshold Th at time Ta and then continues to rise to a first peak value Pb at time Tb and then drops to a lower value before rising back up to a second peak value Pc at time Tc. The second peak value Pc is greater than the first peak value Pb. The signal 50 thereafter drops to zero. The control circuitry determines that signal 50 is indicative of a bottom to top swipe because the first peak value Pb is less than the second peak value Pc, and the lower value results because of a lesser density of capacitive fingers and closer spacing between capacitively coupled fingers associated with the bottom portion of the capacitive sensor 24 as compared to the top portion of the sensor 24.

Figure 22:
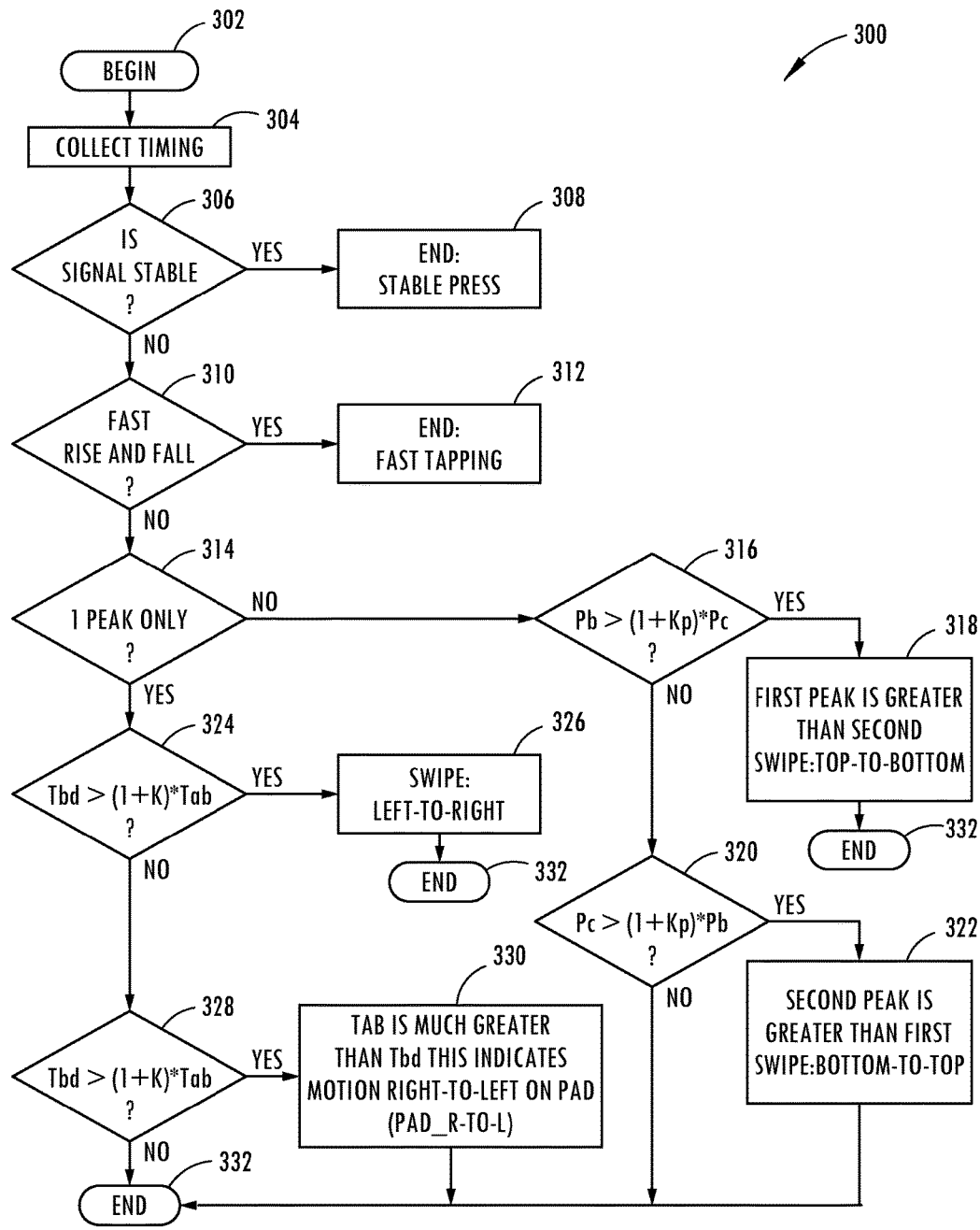
FIG. 22 is a flow diagram illustrating a routine for processing and activating the capacitive switch employing the sensor of FIG. 17.
Figure 23:
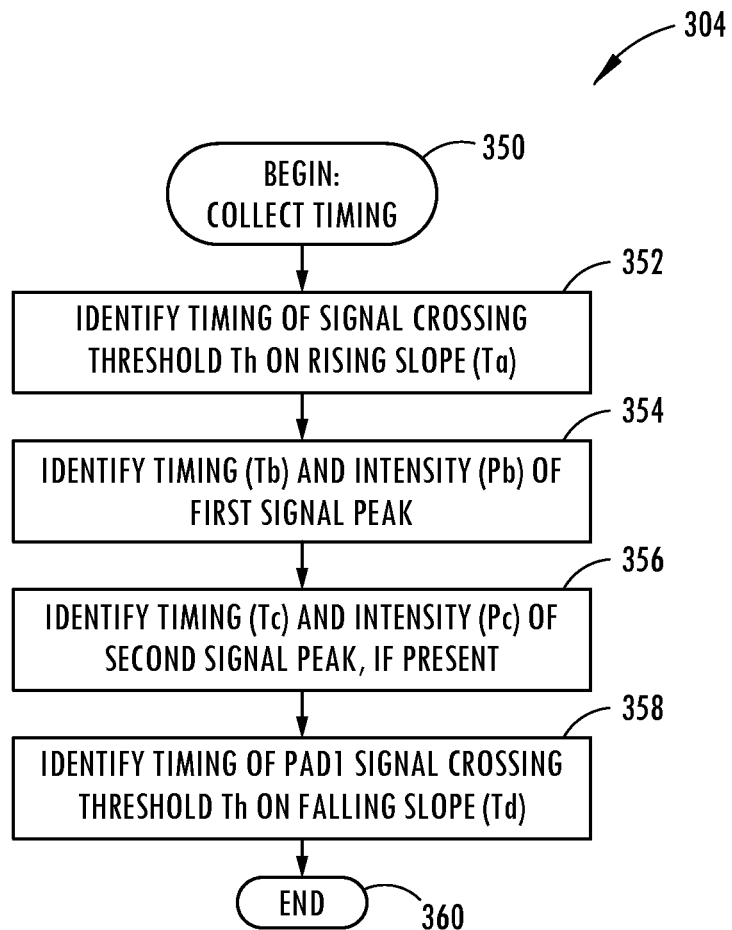
FIG. 23 is a flow diagram illustrating the subroutine of collect timing in the routine of FIG. 22.

A routine 300 for determining activation of the proximity switch 22 employing the capacitive sensor 24 of FIG. 17 is illustrated in FIG. 22, according to one embodiment. Routine 300 begins at step 302 and proceeds to step 304 to execute a collect timing subroutine 304. The collect timing subroutine 304 is shown in FIG. 23. Subroutine 304 begins at step 350 and proceeds to step 352 to identify timing of the signal crossing the threshold Th on the rising slope which is based on time Ta. Next, subroutine 304 identifies the timing Tb and intensity Pb of the first signal peak value in step 354. At step 356, subroutine 304 identifies the timing Tc and intensity Pc of the second signal peak value, if present. Finally, subroutine 304 identifies the timing of the Pad1 signal crossing the Threshold Th on the falling slope which is based on time Td, before ending at step 360.

Following execution of subroutine 304, routine 300 determines if the signal is stable at decision step 306 and, if so, ends with a stable press decision at step 308. Is the signal is not stable, routine 300 proceeds to decision step 310 to determine if there is a fast rise and fall and, if so, ends with a fast tapping decision at step 312. If there is no fast rise and fall, routine 300 determines in decision step 314 whether there is only one peak value. If there is only one peak value, routine 300 proceeds to decision step 324 to determine if time Tbd is greater than (1+K)×Tab and, if so, determines that there is a left to right swipe at step 326 before ending at step 332. If decision step 324 has a negative output, routine 300 proceeds to decision step 328 to determine whether time Tbd is greater than (1+K)×Tab and, if so, determines that time Tab is much greater than time Tbd which indicates motion from right to left on the Pad, and then ends at step 332.

If decision step 314 determines that there is more than one peak, routine 300 proceeds to decision step 316 to determine if first peak signal value Pb is greater than (1+K)×Pc and, if so, determines at step 318 that the first peak Pb is greater than the second peak Pc which is indicative of a top to bottom swipe, and then ends at step 332. Otherwise, decision step 320 determines whether the second peak Pc is greater than (1+K)×Pb and, if so, determines at step 322 that the second peak Pc is greater than the first peak Pb which indicates a bottom to top swipe, and then ends at step 332.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A proximity switch assembly comprising:
a proximity sensor comprising a first electrode comprising first fingers extending outward at differing acute angles relative to each other and a second electrode comprising second fingers interdigitated with the first fingers with variable spacing therebetween along a first direction; and
control circuitry processing a signal in response to a user activation of the proximity sensor and determining sliding activation of the sensor in the first direction and a second direction.

2. The proximity switch assembly of claim 1, wherein the first and second plurality of fingers are interdigitated with variable density along the first direction.

3. The proximity switch assembly of claim 1, wherein the second direction is perpendicular to the first direction.

4. The proximity switch assembly of claim 3 further comprising a third electrode comprising a third plurality of fingers interdigitated with some of the first plurality of fingers of the first electrode, wherein the second electrode and third electrode are processed to determine sliding in the second direction.

5. The proximity switch assembly of claim 4, wherein the control circuitry further determines sliding activation along a third direction between the first and second directions.

6. The proximity switch assembly of claim 1, wherein the control circuitry further determines a tap activation based on the processed signal.

7. The proximity switch assembly of claim 1 further comprising control circuitry monitoring an activation field associated with the proximity sensor and determining an activation of the proximity switch based on rise and fall of the signal relative to a peak value.

8. The proximity switch assembly of claim 1, wherein the proximity switch assembly comprises a capacitive switch comprising one or more capacitive sensors.

9. The proximity switch assembly of claim 1, wherein the assembly is installed on a vehicle.

10. A proximity switch assembly comprising:
a proximity sensor comprising a first electrode comprising first fingers extending outward at differing acute angles relative to each other and a second electrode comprising second fingers interdigitated with the first fingers with variable density along a first direction; and
control circuitry processing a signal in response to a user activation of the proximity sensor and determining sliding activation of the sensor in the first direction and a second direction.

11. The proximity switch assembly of claim 10, wherein the first and second fingers are interdigitated with variable spacing therebetween along a first direction.

12. The proximity switch assembly of claim 10, wherein the second direction is perpendicular to the first direction.

13. The proximity switch assembly of claim 12 further comprising a third electrode comprising a third plurality of fingers interdigitated with some of the first plurality of fingers of the first electrode, wherein the second electrode and third electrode are processed to determine sliding in the second direction.

14. The proximity switch assembly of claim 13, wherein the control circuitry further determines sliding activation along a third direction between the first and second directions.

15. The proximity switch assembly of claim 10 further comprising control circuitry monitoring an activation field associated with the proximity sensor and determining an activation of the proximity switch based on rise and fall of the signal relative to a peak value.

16. A method of activating a proximity switch assembly comprising:
providing a proximity sensor comprising a first electrode comprising first fingers extending outward at differing acute angles relative to each other and a second electrode comprising second fingers such that the first and second fingers are interdigitated with a varying density along a first direction;
processing a signal in response to a user activation of the proximity sensor; and determining sliding activation of the proximity sensor in the first direction and a second direction based on the processed signal.

* * * * *